(12) United States Patent
Iwasa et al.

(10) Patent No.: US 7,230,636 B2
(45) Date of Patent: Jun. 12, 2007

(54) IMAGE RECORDING APPARATUS WITH JET AND SUCTION

(75) Inventors: Hiroshi Iwasa, Kyoto (JP); Hideki Matsuura, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 337 days.

(21) Appl. No.: 10/793,842

(22) Filed: Mar. 8, 2004

(65) Prior Publication Data

US 2004/0179086 A1   Sep. 16, 2004

(30) Foreign Application Priority Data

Mar. 10, 2003  (JP) ............... 2003-062673
Mar. 27, 2003  (JP) ............... 2003-086661
Jan. 23, 2004  (JP) ............... 2004-015164

(51) Int. Cl.
*B41J 2/435* (2006.01)

(52) U.S. Cl. .................................... 347/227

(58) Field of Classification Search ........ 347/224–225, 347/227, 262, 264; 430/270.1; 219/121.11–121.86; 604/313

See application file for complete search history.

(56) References Cited

U.S. PATENT DOCUMENTS 5,496,985 A *  3/1996  Foltz et al. .......... 219/121.67
5,925,024 A *  7/1999  Joffe .................... 604/313
6,242,156 B1 *  6/2001  Teng .................... 430/270.1
6,371,026 B1   4/2002  Ben-Zion et al.

FOREIGN PATENT DOCUMENTS

| JP | 2886087 | 2/1999 |
|---|---|---|
| JP | 2886115 | 2/1999 |
| JP | 2000-56400 A | 2/2000 |

* cited by examiner

*Primary Examiner*—Hai Pham
(74) *Attorney, Agent, or Firm*—McDermott Will & Emery LLP

(57) ABSTRACT

A gas is generated from a printing plate by exposure of the printing plate. A gas diffusing suction unit jets air from air jet ports to diffuse the gas generated from the printing plate by irradiation of laser light. The gas diffused by the air is sucked along with the air from a gas suction opening of the gas diffusing suction unit. At this time, a gas suction velocity is set to 1.2 or more times an air jet velocity to suck the gas/air efficiently. The gas/air may be sucked efficiently by setting a volume of suction to 30 or more times a volume of air jet.

25 Claims, 17 Drawing Sheets

IMAGE RECORDING APPARATUS WITH JET AND SUCTION

BACKGROUND OF THE INVENTION

1. Field of the Invention

This invention relates to an image recording apparatus for recording images on a photosensitive material mounted peripherally of a drum.

2. Description of the Related Art

In an image recording apparatus for recording images by emitting laser light to a photosensitive material and vaporizing components of the photosensitive material as a gas from the surface of the photosensitive material, the gas generated from the photosensitive material enters the exposure head and contaminates the interior of the exposure head. Thus, an image recording apparatus with a gas suction device has been proposed as described in Japanese Patent No. 2886087.

It is well known that such an image recording apparatus can achieve an improved gas suction efficiency with a gas suction opening disposed adjacent the surface of the photosensitive material.

However, where such an apparatus uses a clamp mechanism for clamping an end of a printing plate, as a device for mounting the printing plate peripherally of a rotatable drum, it is difficult to place the suction opening adjacent the drum since the clamp mechanism has a certain size. Then, a large volume of flow is required to suck the gas. In other words, a suction volume per unit time must be increased. Thus, an image recording apparatus with an improved gas suction efficiency has also been proposed as described in Japanese Unexamined Patent Publication 2000-56400, in which the gas generated from the surface of a printing plate is sucked while being separated from the printing plate by another gas directed to the drum. Actually, however, the gas generated from the photosensitive material is not sucked completely or efficiently. Consequently, when images are recorded on the photosensitive material continuously for a long time, the gas generated from the photosensitive material inevitably enters the exposure head to contaminate the interior of the exposure head.

SUMMARY OF THE INVENTION

The object of this invention, therefore, is to provide an image recording apparatus for recording images by emitting laser light to a photosensitive material and vaporizing components of the photosensitive material as a gas from the surface of the photosensitive material, which apparatus effectively minimizes entry to an exposure head of the gas generated from the photosensitive material.

The above object is fulfilled, according to this invention, by an image recording apparatus having a drum for supporting a photosensitive material mounted on a peripheral surface thereof, a drive device for rotating the drum about an axis thereof, and a recording device for recording an image on the photosensitive material mounted on the peripheral surface of the drum, the recording device comprising:

a light emitting device for emitting a light beam to the photosensitive material on the drum;

a jetting device including a jet port disposed upstream of the light emitting device with respect to a direction of rotation of the drum for jetting a first gas for diffusing a second gas generated by irradiation of the light from the light emitting device; and a suction device including a suction opening disposed downstream of the light emitting device with respect to the direction of rotation of the drum and having a larger diameter than the jet port for sucking the second gas diffused by the jetting device, the gases being sucked at a velocity higher than a velocity of the first gas jetted from the jetting device and in a larger volume per unit time than a volume per unit time of the first gas jetted from the jetting device.

With this image recording apparatus, the gas generated from the surface of the photosensitive material by irradiation of a light beam such as laser light may be sucked with increased efficiency. This minimizes the chance of entry to the exposure head of the gas generated from the surface of the photosensitive material.

In a preferred embodiment, the velocity of the gases sucked by the suction device is at least 1.2 times the velocity of the first gas jetted from the jetting device.

Preferably, the volume per unit time of the gases sucked by the suction device is at least 30 times the volume per unit time of the first gas jetted from the jetting device.

A direction for jetting the first gas from the jet port and a normal to the peripheral surface of the drum may intersect each other at an angle of 40 to 50 degrees.

In another preferred embodiment, the drive device is arranged to rotate the drum at 4.5 to 6 m/sec.

In this embodiment, the velocity of the gases sucked by the suction device, preferably, is at most 1.8 times the velocity of the first gas jetted from the jetting device.

In a different aspect of this invention, an image recording apparatus comprises:

a recording drum for supporting a photosensitive material fixed to a peripheral surface thereof;

a rotating device for rotating the recording drum;

an exposure head including a laser light source for emitting laser light, an objective lens for directing the laser light to the photosensitive material fixed to the peripheral surface of the recording drum, and a sealed case for storing at least the laser light source;

a pressurizing device for pressurizing an interior of the case by feeding a first gas under pressure from outside;

a jetting device for diffusing a second gas generated by irradiation of the laser light, by jetting out the first gas from adjacent the objective lens; and a suction device disposed downstream of the jetting device with respect to a direction of jetting the first gas for sucking the second gas diffused by the jetting device.

Other features and advantages of the invention will be apparent from the following detailed description of the embodiments of the invention.

BRIEF DESCRIPTION OF THE DRAWINGS

For the purpose of illustrating the invention, there are shown in the image recordings several forms which are presently preferred, it being understood, however, that the invention is not limited-to the precise arrangement and instrumentalities shown.

DESCRIPTION OF THE PREFERRED EMBODIMENTS

A first embodiment of this invention will be described hereinafter with reference to the image recordings.

Figure 1:
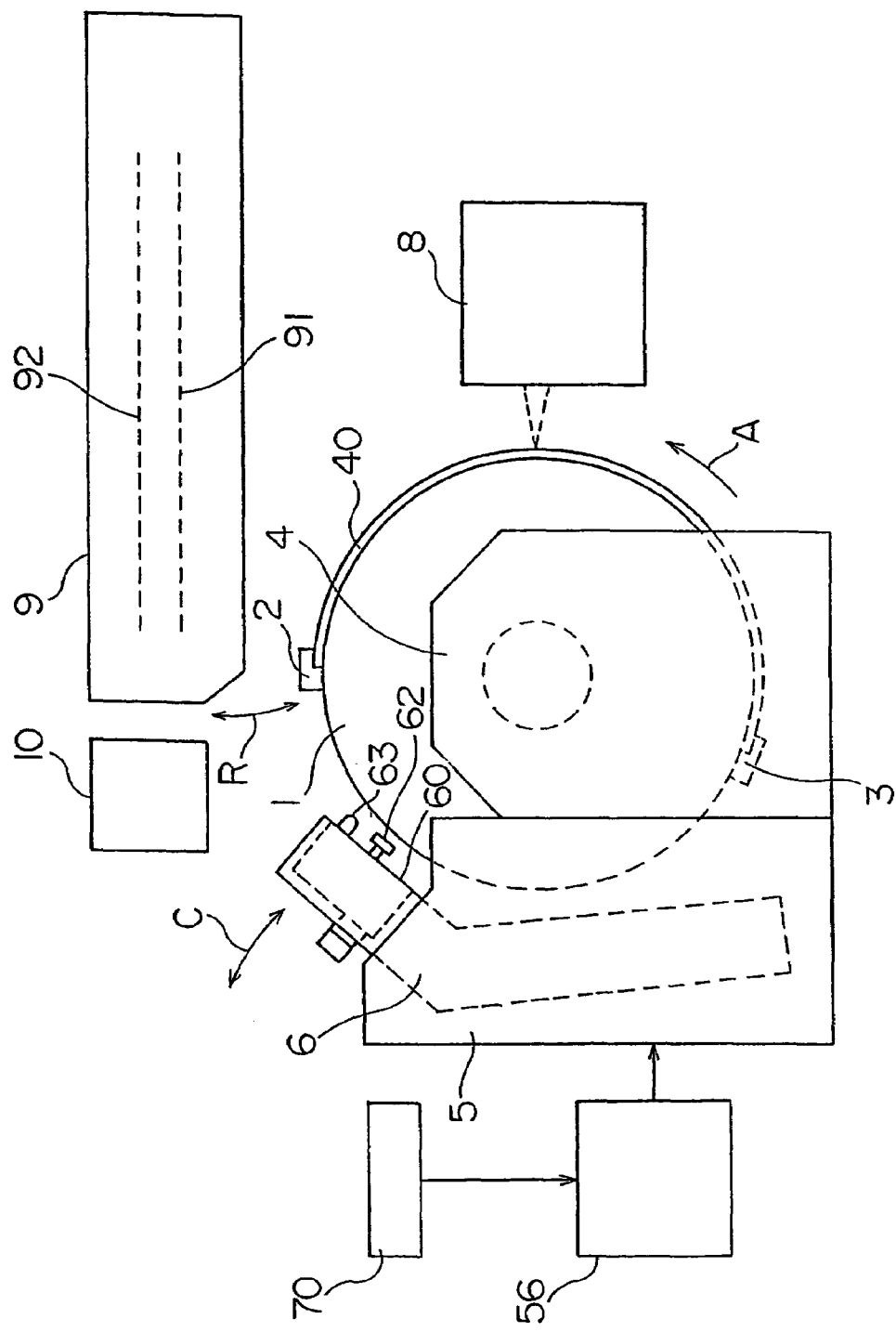
FIG. 1 is a schematic side view of an image recording apparatus in a first embodiment of this invention.
Figure 2:
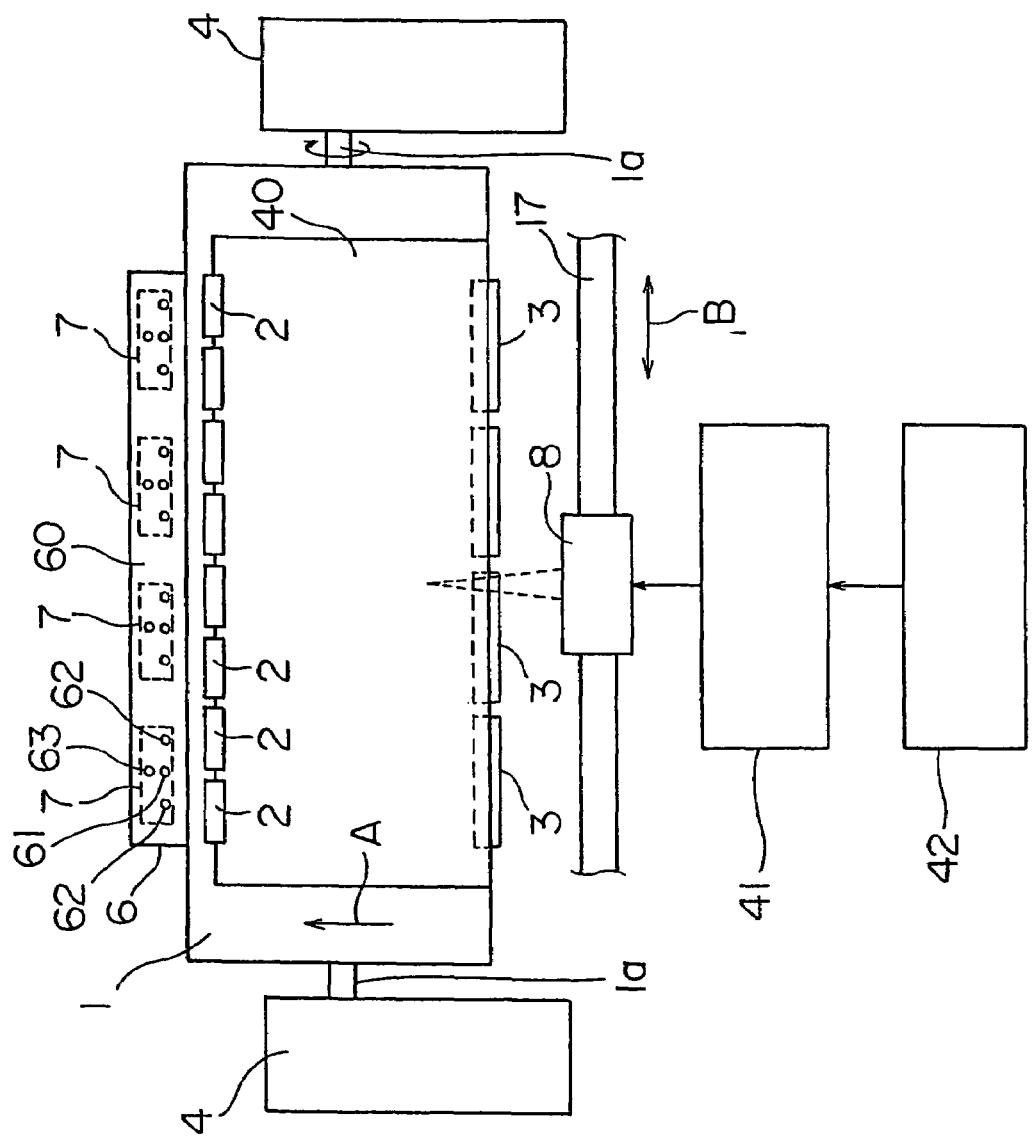
FIG. 2 is a schematic front view of the image recording apparatus in the first embodiment of the invention.

FIG. 1 is a schematic side view of an image recording apparatus in the first embodiment of this invention. FIG. 2 is a schematic front view of the image recording apparatus.

Referring to FIGS. 1 and 2, the image recording apparatus includes a cylindrical recording drum 1. The recording drum 1 is driven by a drive device 4 to rotate in a direction of arrow A (main scanning direction) about a rotary shaft 1a. The recording drum 1 holds an aluminum printing plate 40 mounted peripherally thereof as a photosensitive material. An end of the printing plate 40 is fixed to the peripheral surface of the recording drum 1 by a plurality of forward end clamps 2. The other end of the printing plate 40 is fixed to the peripheral surface of the recording drum 1 by a plurality of rear end clamps 3.

An exposure head 8 with a plurality of laser diodes is disposed forwardly of the recording drum 1. The exposure head 8 is attached to a guide 17 (FIG. 2) to be movable in directions of arrow B (auxiliary scanning direction) shown in FIG. 2, synchronously with rotation of the recording drum 1.

The plurality of laser diodes in the exposure head 8 are driven by a laser diode drive circuit 41. The laser diode drive circuit 41 drives the laser diodes in the exposure head 8 in response to image signals from an image signal generating circuit 42. Light beams emitted from these laser diodes are directed from the exposure head 8 to the printing plate 40.

As shown in FIG. 1, a clamp drive device 5 is disposed rearwardly of the recording drum 1. The clamp drive device 5 is used to attach the rear end clamps 3 to the recording drum 1, detach the rear end clamps 3 from the recording drum 1, and release the forward end clamps 2 on the recording drum 1.

The clamp drive device 5 has a pair of clamp arms 6 swingable in directions of arrow C shown in FIG. 1. A drive bar 60 extends between the pair of clamp arms 6, and carries a plurality of first drive devices 7. Each of these first drive devices 7 has a drive pin 61 for locking and unlocking the rear end clamp 3, two holding pins 62 for holding the rear end clamp 3, and a release pin 63 for releasing the forward end clamp 2 when attaching the printing plate 40. The clamp drive device 5 has also second drive devices (not shown) for releasing the forward end clamps 2 when detaching the printing plate 40.

As shown in FIG. 1, a transport unit 9 is disposed above the recording drum 1 to be swingable in directions of arrow R in FIG. 1. The transport unit 9 has a first transport path 91 for feeding printing plates, and a second transport path 92 for discharging printing plates. When feeding the printing plate 40, the printing plate 40 is fed to the recording drum 1 through the first transport path 91 of the transport unit 9. When discharging the printing plate 40, the printing plate 40 detached from the recording drum 1 is transported out through the second transport path 92 of the transport unit 9.

A punching device 10 is disposed adjacent a forward end of the transport unit 9 for forming positioning perforations in the printing plate 40. Before being fed to the recording drum 1, the printing plate 40 is fed to the punching device 10 through the first transport path 91 of the transport unit 9, where positioning perforations are formed in peripheries of the printing plate 40. The positioning perforations of the printing plate 40 are engageable with positioning pins (not shown) arranged on the peripheral surface of the recording drum 1.

A controller 56 in FIG. 1 includes a CPU (central processing unit), an input interface and so on, for controlling the components of the image recording apparatus. The controller 56 has a console panel 70 connected thereto for the operator to input various information and commands. Such information includes, for example, a rotating speed of the recording drum 1, a type and size of printing plate 40 used, the number of printing plates fixed to the recording drum 1 at a time, a type and quantity of gas generated from the printing plate 40, a velocity and volume of air delivered from air jet ports 12 (described hereinafter), and a velocity and volume of suction gas from a gas suction opening 13 (described hereinafter).

Figure 3:
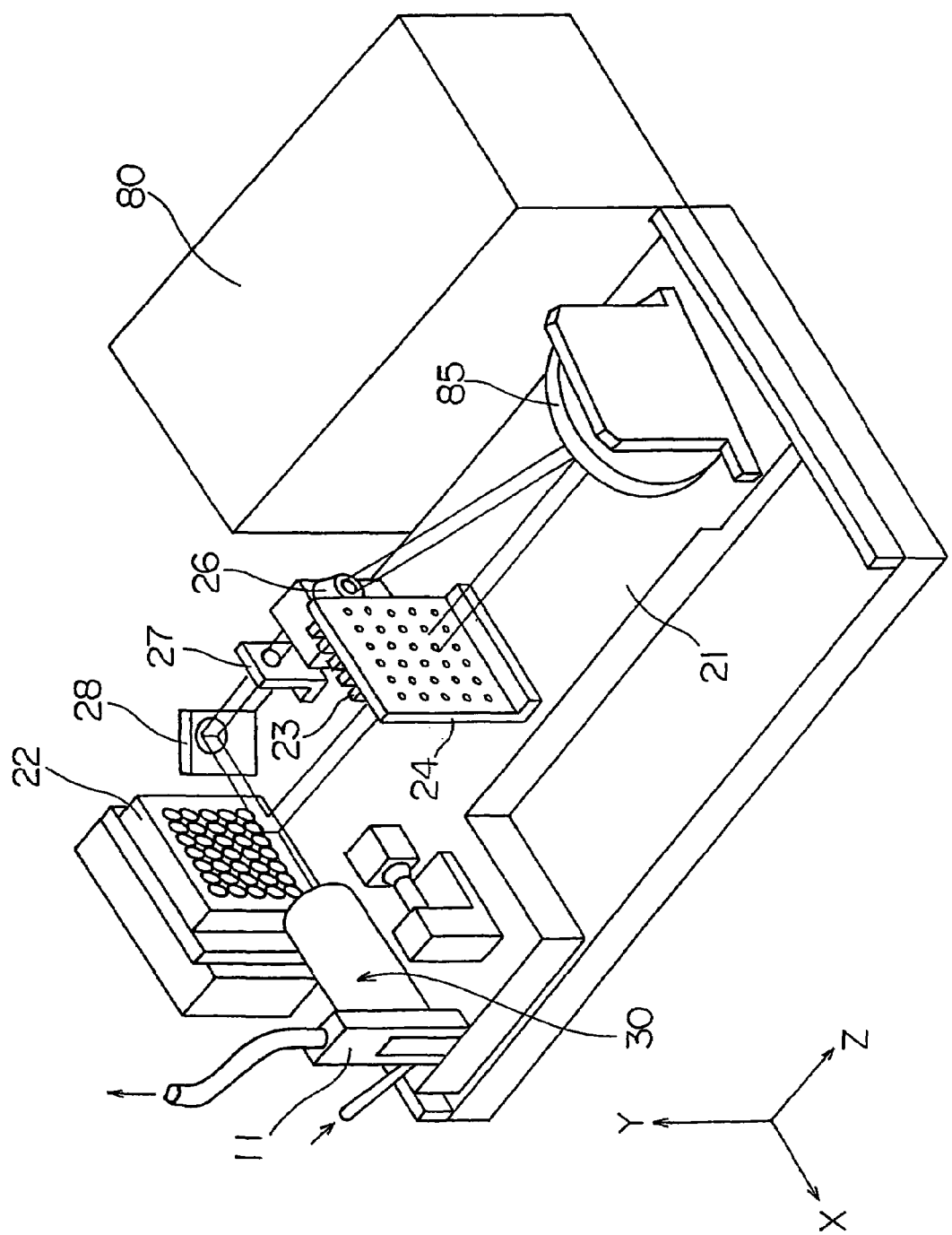
FIG. 3 is a perspective view of an exposure head in the image recording apparatus in the first embodiment of the invention.

FIG. 3 is a perspective view of the exposure head 8 in the image recording apparatus in the first embodiment of this invention. In this figure, the two directions extending perpendicular to each other in a horizontal plane are regarded as X-direction and Z-direction, and the vertical direction as Y-direction. In FIG. 3, a main base 21 has, arranged thereon, a laser diode array 22, a plurality of cylindrical lenses 23, a slit plate 24, a convex mirror 25, a stereo projection lens 26, a lens 27, a deflecting mirror 28, a zoom lens system 30 and a gas diffusing suction unit 11.

A storage case 80 is attached laterally of the main base 21 for storing a substrate having a laser diode driver and the like mounted thereon.

The laser diode array 22 has the plurality of laser diodes, with a collimator lens attached to a tip end of each laser diode. The collimator lens condenses, in the Y-direction, laser light emitted from the laser diode.

The cylindrical lenses 23 extend in the Y-direction and are juxtaposed in the X-direction. These cylindrical lenses 23 condense, in the X-direction, the laser light emitted from the laser diode array 22.

The slit plate 24 effects a beam shaping of the laser light having passed through the cylindrical lenses 23. The laser light having passed through the slit plate 24 is reflected by the convex mirror 25 to impinge on the stereo projection lens 26. The convex mirror 25 and stereo projection lens 26 constitute a reducing optical system of a first stage.

The laser light having passed through the stereo projection lens 26 passes through the lens 27, and is then reflected by the deflecting mirror 28 to impinge on the zoom lens system 30. The zoom lens system 30 includes a focusing motor and a zooming motor. The lens 27, deflecting mirror 28 and zoom lens system 30 constitute a reducing optical system of a second stage. The zoom lens system 30 condenses the laser light on the printing plate 40 mounted on the recording drum 1, through an objective lens mounted in the gas diffusing suction unit 11.

Figure 4:
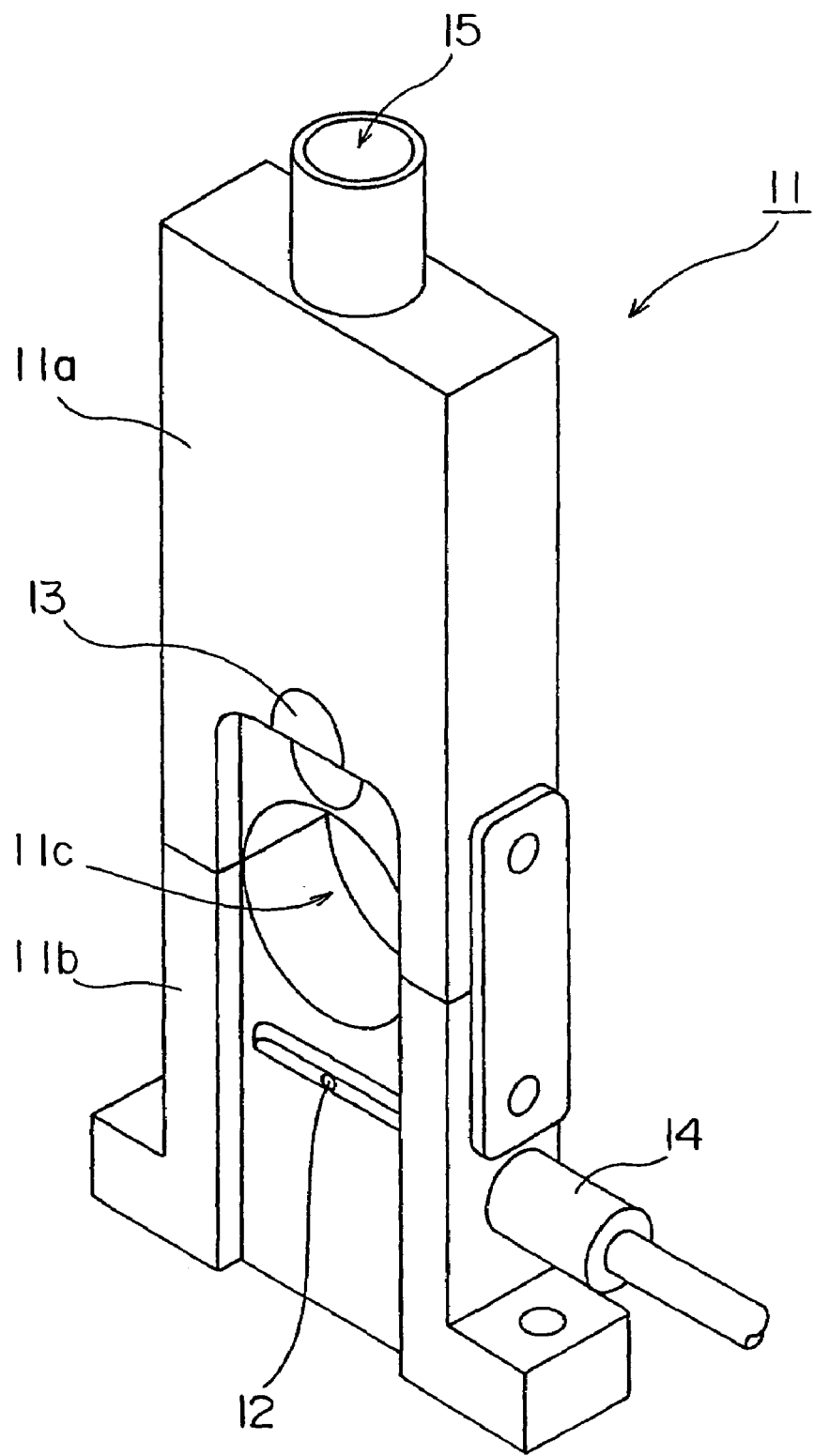
FIG. 4 is a perspective view showing a gas diffusing suction unit of the exposure head in the image recording apparatus in the first embodiment of the invention.
Figure 5:
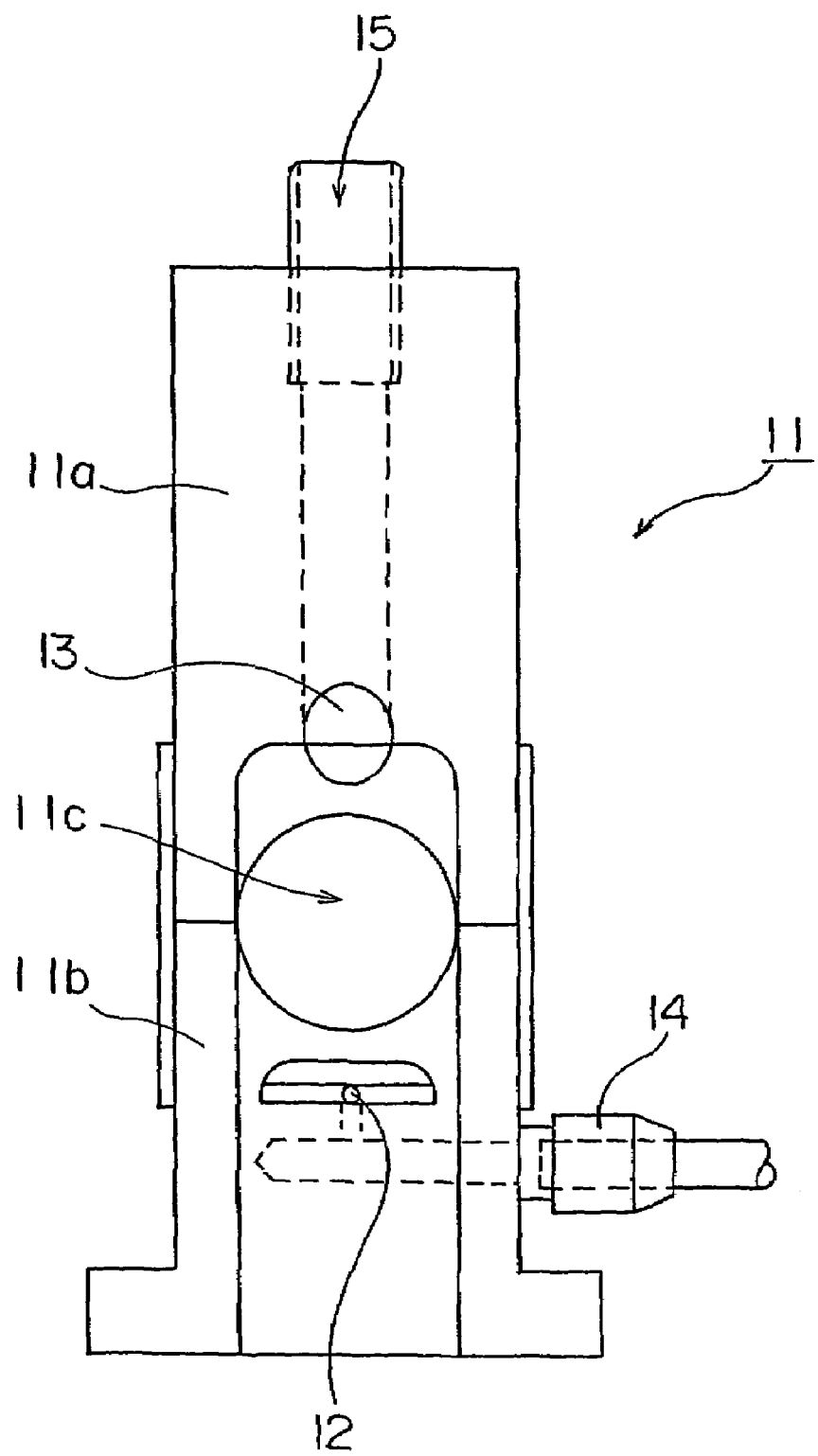
FIG. 5 is a front view showing the gas diffusing suction unit of the exposure head.
Figure 6:
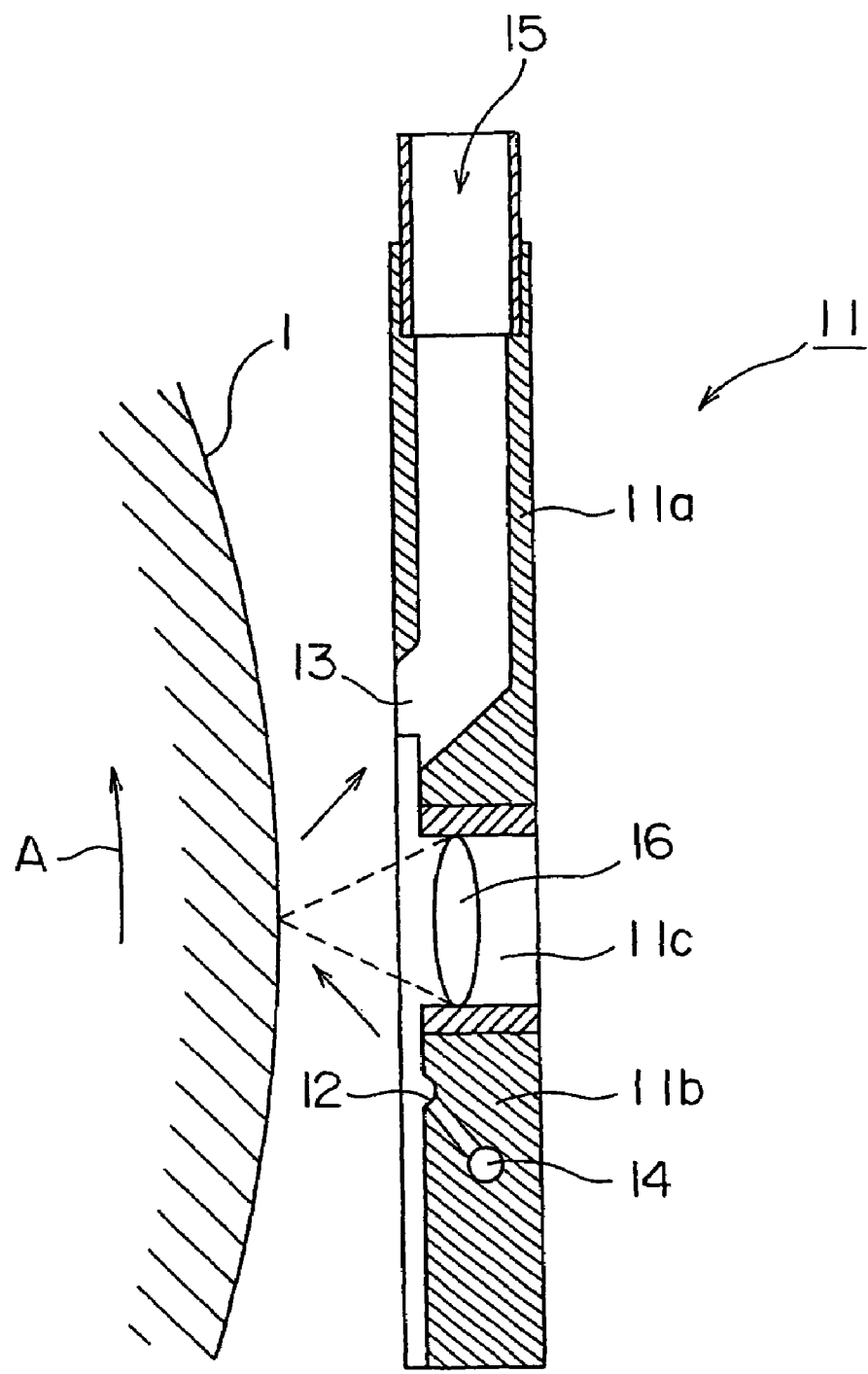
FIG. 6 is a view in vertical section showing the gas diffusing suction unit of the exposure head.
Figure 17:
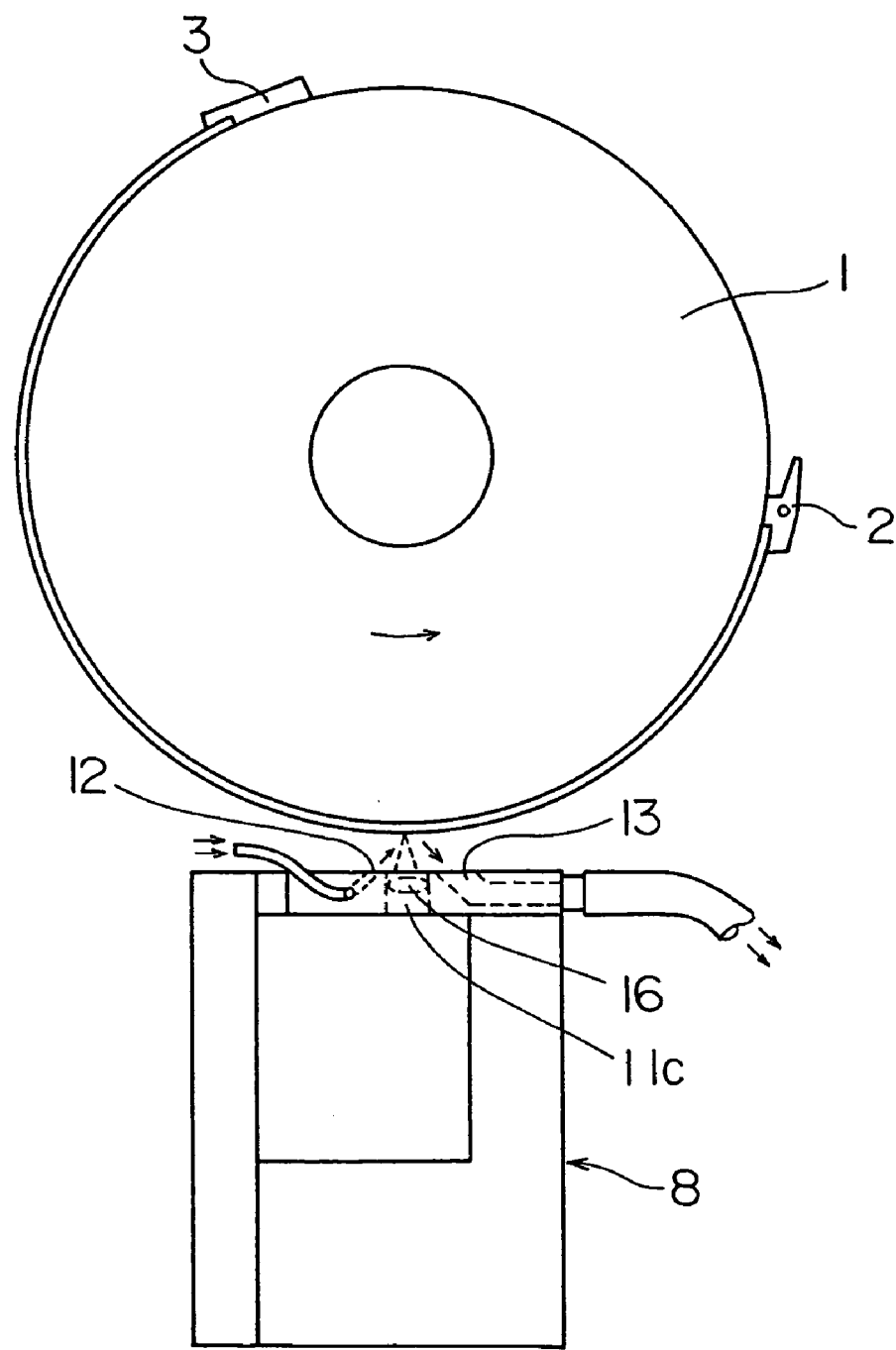
FIG. 17 is a schematic view showing the interior of the exposure head and adjacent components in the image recording apparatus in the first embodiment of the invention.

FIG. 4 is a perspective view showing the gas diffusing suction unit 11 of the exposure head 8 in the image recording apparatus in the first embodiment of the invention. FIG. 5 is a front view of the gas diffusing suction unit 11. FIG. 6 is a view in vertical section showing the gas diffusing suction unit 11. FIG. 17 is a schematic view showing the interior of the exposure head 8 and adjacent components in the image recording apparatus in the first embodiment of the invention.

Referring to FIGS. 4 through 6, the gas diffusing suction unit 11 includes an upper block 11a and a lower block 11b. A circular lens bore 11c is formed in a connection between the upper block 1a and lower block 11b. This lens bore 11c has an objective lens 16 mounted therein. The upper block 11a and lower block 11b are easily separable from each other to facilitate adjustment, cleaning and changing of the objective lens 16.

The lower block 11b has air jet ports 12 formed in a front surface thereof. The air jet ports 12 are in communication with an air supply port 14 formed in a side surface of the lower block 11b. These air jet ports 12 are arranged to form an angle of 45 degrees between a direction for jetting air from the air jet ports 12 to an upstream position with respect to the direction of rotation of the recording drum 1 (i.e. the direction of arrow A) and a normal to the peripheral surface of the recording drum 1. The air jet ports 12 are directed to a position on the recording drum 1 irradiated by the laser light from the objective lens 16. As a result, the gas generated by irradiation of the laser light is diffused by the air.

The upper block 11a has, formed in a front surface thereof, the gas suction opening 13 having 25 times as large an area as the air jet ports 12. The gas suction opening 13 is disposed downstream with respect to the direction of rotation of the recording drum 1 (i.e. the direction of arrow A), and is directed substantially to the position on the recording drum 1 irradiated by the laser light from the objective lens 16. The gas suction opening 13 is in communication with a gas exhaust port 15 disposed in a top surface of the upper block 11a. Thus, the gas generated by irradiation of the laser light is sucked along with the air.

Figure 7:
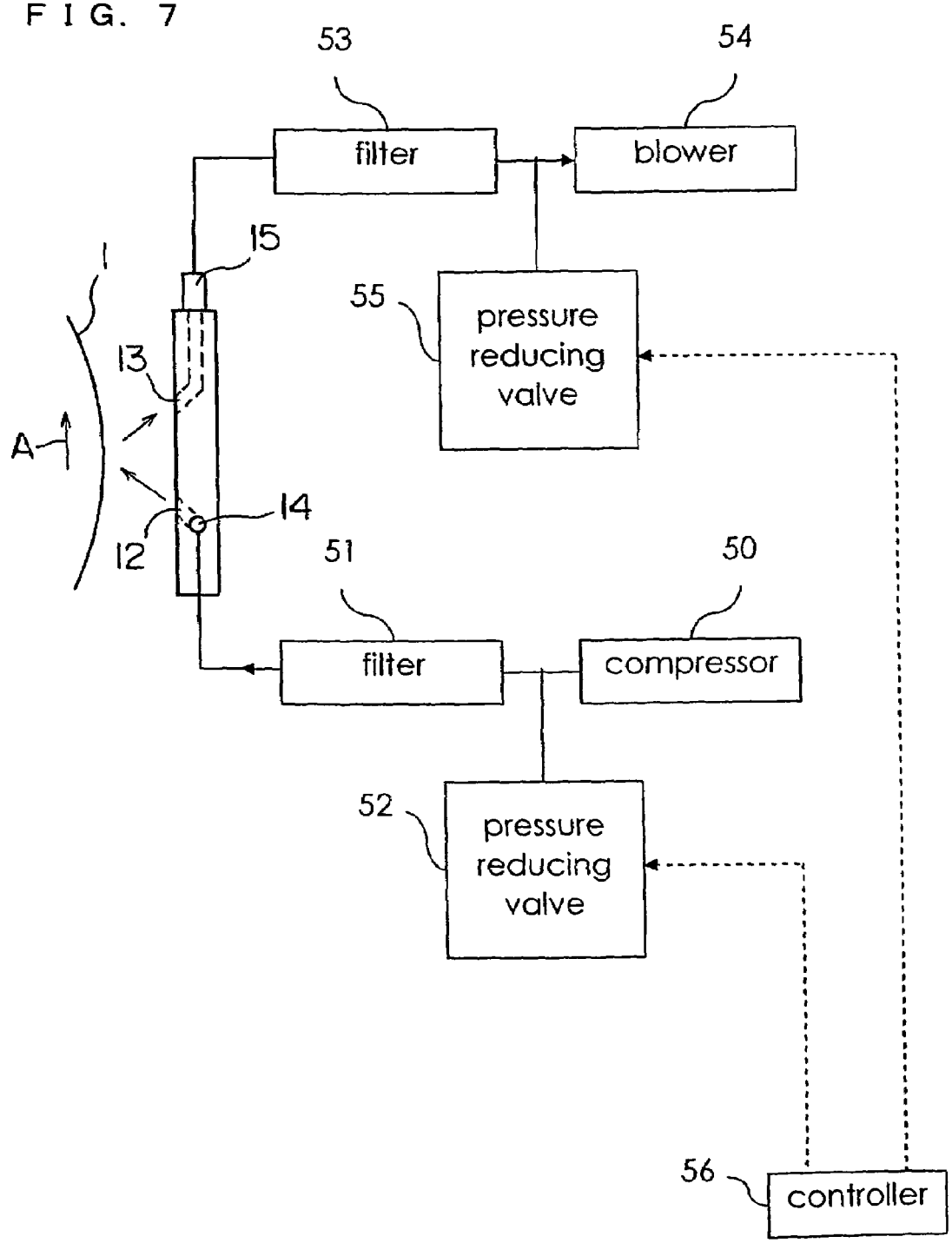
FIG. 7 is a block diagram showing a jet system and an exhaust system of the gas diffusing suction unit.

FIG. 7 is a block diagram showing a jet system and an exhaust system of the gas diffusing suction unit 11.

Referring to FIG. 7, the air supply port 14 of the gas diffusing suction unit 11 is connected to a compressor 50 through a filter 51. A pressure reducing valve 52 is connected to a position downstream of the compressor 50.

The gas exhaust port 15 of the gas diffusing suction unit 11 is connected to a blower 54 through a filter 53. A pressure reducing valve 55 is connected to a position upstream of the blower 54.

Clean air is supplied from the compressor 50 to the air supply port 14 of the gas diffusing suction unit 11 through the filter 51. Thus, the air is blown from the air jet ports 12 of the gas diffusing suction unit 11 to the peripheral surface of the recording drum 1. The gas generated in time of exposure is sucked along with the air into the gas suction opening 13 of the gas diffusing suction unit 11, and transmitted from the gas exhaust port 15 to the blower 54 through the filter 53.

The pressure reducing valves 52 and 55 are controlled by the controller 56. The pressure reducing valve 52 is controlled to adjust a jet velocity and jet volume (volume of air jetted per unit time) from the air jet ports 12 of the gas diffusing suction unit 11. The pressure reducing valve 55 is controlled to adjust a suction velocity and suction volume (volume of gas sucked per unit time) from the gas suction opening 13 of the gas diffusing suction unit 11.

Figure 8:
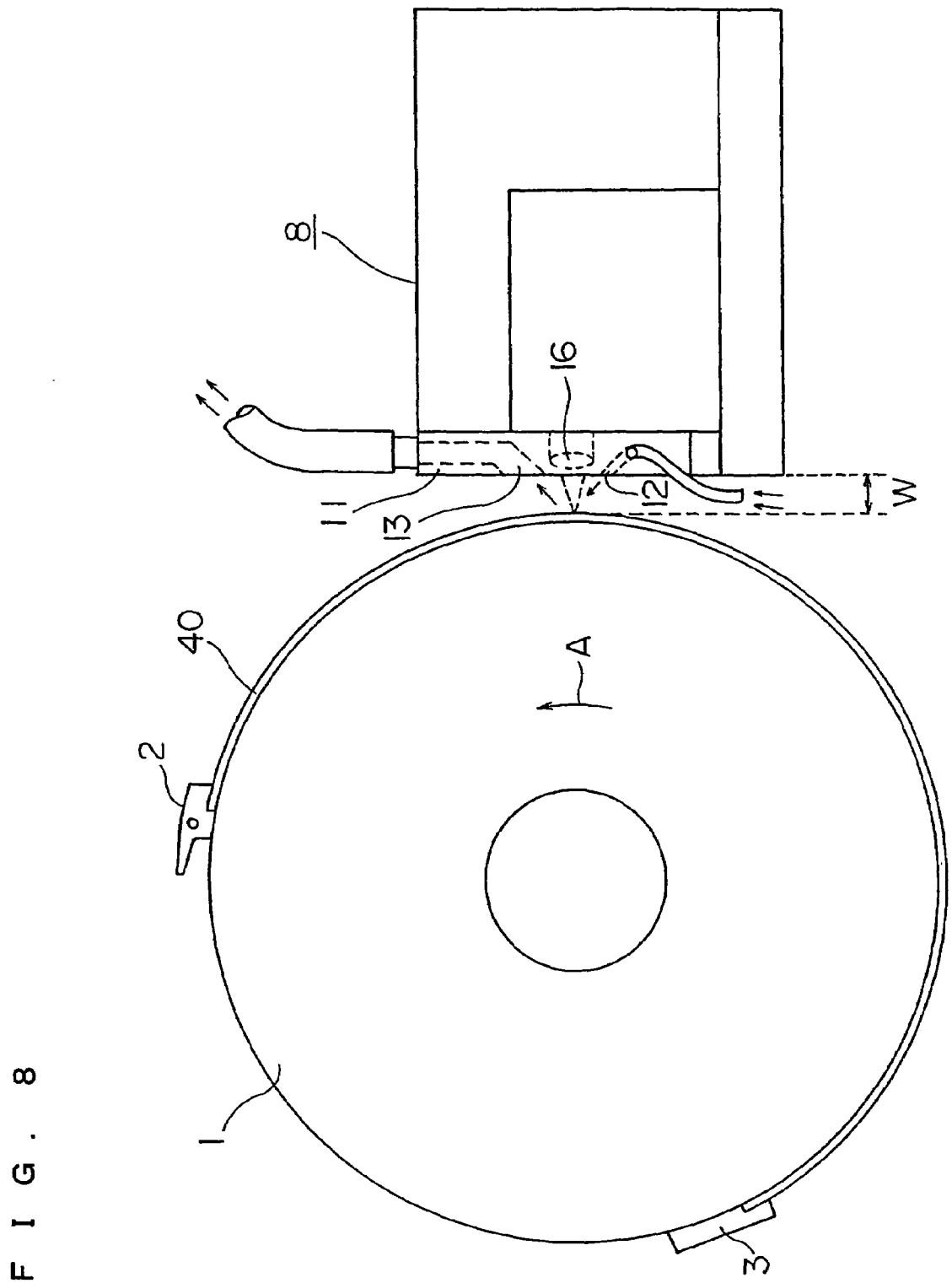
FIG. 8 is a side view of the exposure head.

FIG. 8 is a side view of the recording drum 1 and exposure head 8 in time of exposure. In FIG. 8, the printing plate 40 is mounted peripherally on the recording drum 1, with the forward end of the printing plate 40 fixed by the forward end clamps 2 and the rear end fixed by the rear end clamps 3. In this state, the recording drum 1 rotates in the direction of arrow A.

The exposure head 8 emits laser light through the objective lens 16 to the printing plate 40 on the recording drum 1 in rotation. The gas is generated from the printing plate 40 upon exposure of the printing plate 40. At this time, air is blown from the air jet ports 12 of the gas diffusing suction unit 11, i.e. from a position upstream in the direction of rotation of the recording drum 1, to the vicinity of the position on the recording drum 1 irradiated by the laser light. The gas generated from the printing plate 40 by irradiation of the laser light is diffused by the air, and blown off chiefly downstream in the direction of rotation of the recording drum 1. The gas diffused by the air is sucked along with the air into the gas suction opening 13 of the gas diffusing suction unit 11. The gas generated may be blown off effectively when the direction of the air jetted from the air jet ports 12 crosses a normal to the peripheral surface of the recording drum 1 at an angle of 40 to 50 degrees.

In the image recording apparatus having the above construction, the clamp mechanism including the forward end clamps 2 and rear end clamps 3 is employed as a mechanism for attaching the printing plate 40 to the recording drum 1. This clamp mechanism has the advantage of more firmly attaching the printing plate 40 to the recording drum 1 than where the printing plate 40 attached to the recording drum 1 by vacuum suction or the like.

On the other hand, however, the gas diffusing suction unit 11 and recording drum 1 must be spaced from each other by a certain distance in order to avoid interference between the gas diffusing suction unit 11 and the forward end clamps 2 and rear end clamps 3. Therefore, as shown in FIG. 8, a distance W of at least about 5 mm is secured between the surface of the printing plate 40 and an installation plane of the air jet ports 12 and gas suction opening 13 in the gas diffusing suction unit 11. Where such a large distance W exists between the surface of the printing plate 40 and the installation plane of the air jet ports 12 and gas suction opening 13 in the gas diffusing suction unit 11, it is difficult to suck completely and efficiently the gas generated from the printing plate 40.

The image recording apparatus according to this invention, therefore, sets an appropriate aperture ratio between the air jet ports 12 and gas suction opening 13, and an appropriate relationship between the jet velocity and jet volume from the air jet ports 12 and the suction velocity and suction volume from the gas suction opening 13. With these settings, the gas generated from the printing plate 40 may be sucked completely and efficiently even where the large distance W exists between the surface of the printing plate 40 and the installation plane of the air jet ports 12 and gas suction opening 13 in the gas diffusing suction unit 11.

Figure 9:
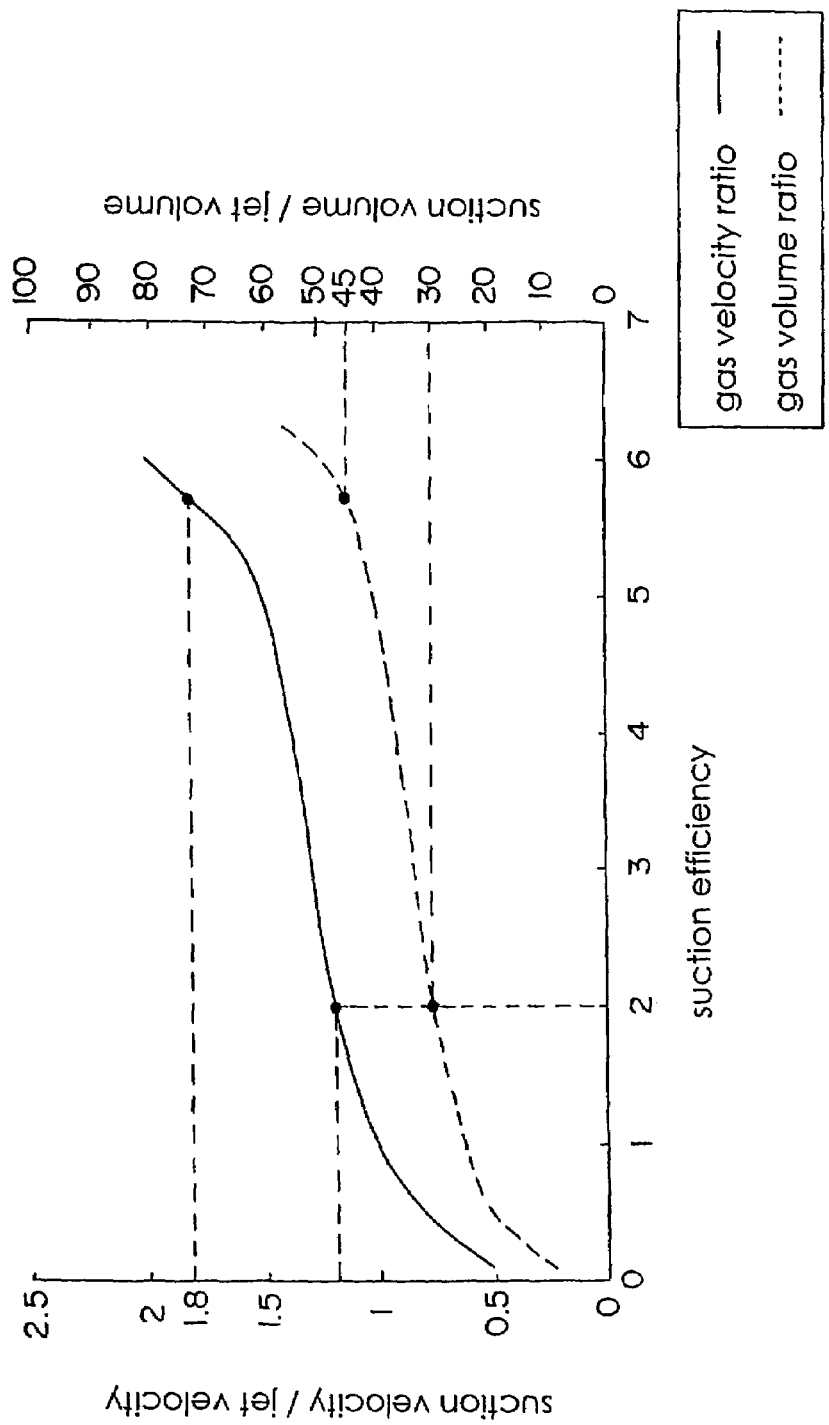
FIG. 9 is a graph showing a relationship between gas suction efficiency and suction velocity/jet velocity ratio of the gas diffusing suction unit and a relationship between suction efficiency and suction volume/jet volume ratio of the gas diffusing suction unit in time of a drum rotating speed set to 5.65 m/sec.
Figure 12:
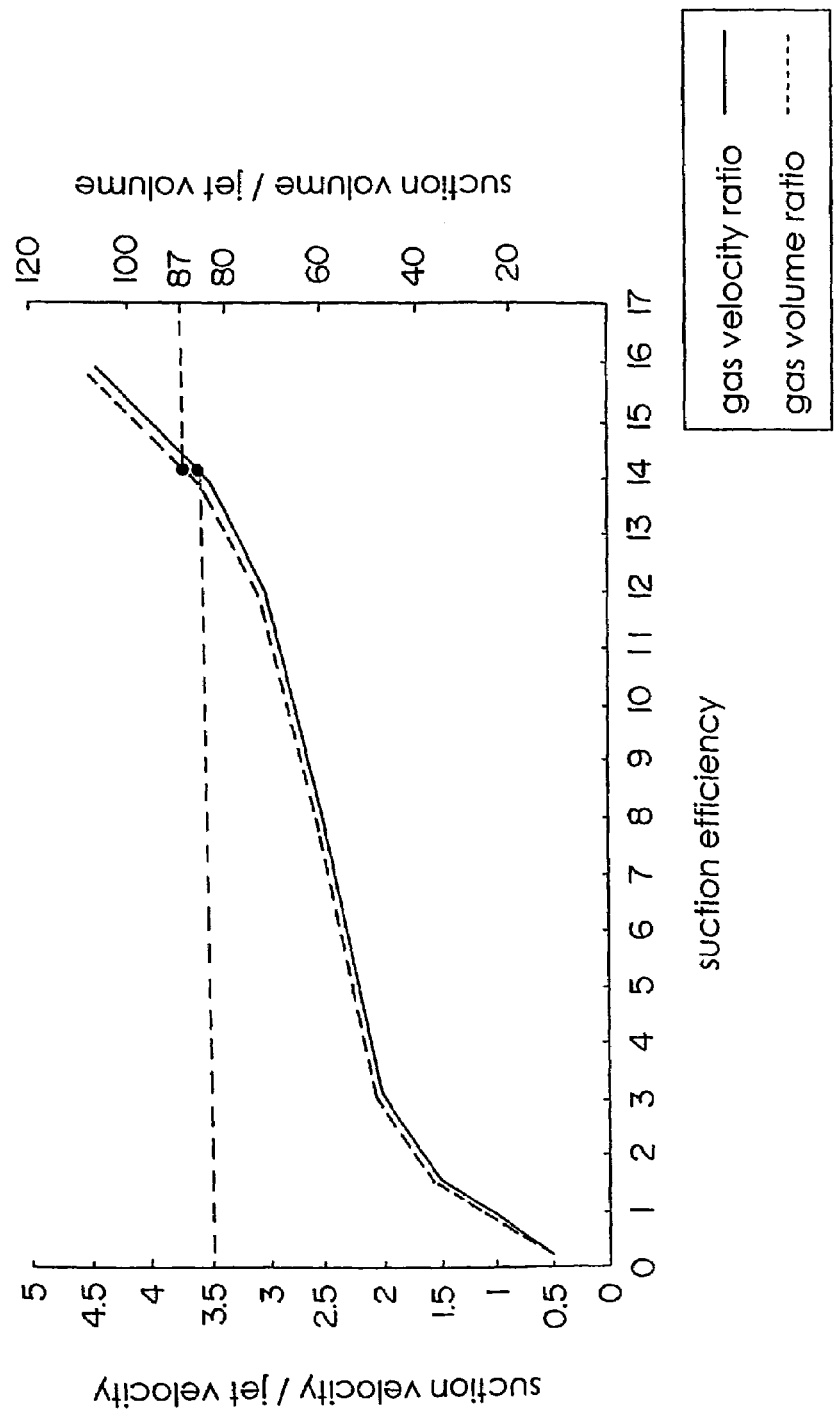
FIG. 12 is a graph showing a relationship between velocity ratio and volume ratio, and suction efficiency, of the gas diffusing suction unit in time of the rotating speed of the recording drum set to 11.3 m/sec.

FIGS. 9 and 12 are graphs showing a relationship between jet velocity and jet volume from the air jet ports 12 and suction efficiency, and a relationship between suction velocity and suction volume from the gas suction opening 13 and suction efficiency.

FIG. 9 is a graph showing a relationship between gas suction efficiency and a value obtained by dividing the suction velocity by the jet velocity of the gas diffusing suction unit 11 and a relationship between gas suction efficiency and a value obtained by dividing the suction volume by the jet volume of the gas diffusing suction unit 11. In this graph, gas suction efficiency is set to 1 when the ratio between the suction velocity and the jet velocity is 1:1.

This experiment was conducted with a drum rotating speed set to 5.65 m/sec. The distance W between the surface of the printing plate 40 and the installation plane of the air jet ports 12 and gas suction opening 13 in the gas diffusing suction unit 11 was 14 mm. Similar results are obtained when the drum rotating speed is in a range of 4.5 to 6 m/sec.

As shown in FIG. 9, suction efficiency is about twice as high when the suction velocity from the gas suction opening 13 is 1.2 times the jet velocity from the air jet ports 12, as when the suction velocity and jet velocity are in the 1:1 ratio. It will be seen that suction efficiency tends to increase when the suction velocity is 1.2 or more times the jet velocity. Thus, the gas/air may be sucked efficiently by setting the suction velocity from the gas suction opening 13 to 1.2 or more times the jet velocity from the air jet ports 12.

In this embodiment, the gas suction opening 13 has an aperture 25 times the aperture of the air jet ports 14. In FIG. 9, a dotted line represents a relationship between suction efficiency and suction volume/jet volume. The suction volume is a product of the suction velocity and the aperture of the gas suction opening 13. The jet volume is a product of the jet velocity and the aperture of the air jet ports 12. Suction efficiency is set to 1 when the ratio between suction velocity and jet velocity is 1:1, i.e. the ratio between suction volume and jet volume is 25:1. As shown in FIG. 9, suction efficiency doubles when the suction volume from the gas suction opening 13 is 30 times the jet volume from the air jet ports 12. It will be seen that suction efficiency tends to increase when the suction volume is 30 or more times the jet volume. Thus, the gas/air may be sucked efficiently by setting the suction volume from the gas suction opening 13 to 30 or more times the jet volume from the air jet ports 12.

As seen from FIG. 9, the upward tendency of suction efficiency will fall off when the suction velocity/jet velocity ratio is about 1.8 or more or when the suction volume/jet volume ratio exceeds about 45. Assuming that the jet velocity and jet volume are fixed, it is necessary to increase the suction velocity or suction volume by the blower 54 in order to enlarge the suction velocity/jet velocity ratio or the suction volume/jet volume ratio. For this, the output of the blower 54 has to be increased. A prior knowledge of a limit where the upward tendency of suction efficiency falls off will be convenient since it is not imperative to increase the output of the blower.

Thus, when the drum rotating speed is set to 4.5 to 6 m/sec, it is preferred that the suction velocity/jet velocity ratio is set to 1.8 or less, or the suction volume/jet volume ratio is set to 45 or less.

Next, FIG. 12 is a graph showing a relationship between gas suction efficiency and suction velocity/jet velocity ratio and a relationship between suction efficiency and suction volume/jet volume ratio of the gas diffusing suction unit 11 in time of the drum rotating speed set to 11.3 m/sec. The distance W between the surface of the printing plate 40 and the installation plane of the air jet ports 12 and gas suction opening 13 in the gas diffusing suction unit 11 is 14 mm.

As shown in FIG. 12, suction efficiency is about twice as high when the suction velocity from the gas suction opening 13 is 1.8 times the jet velocity from the air jet ports 12, as when the suction velocity and jet velocity are in the 1:1 ratio. It will be seen that suction efficiency tends to increase when the suction velocity is 1.8 or more times the jet velocity. Thus, the gas/air may be sucked efficiently by setting the suction velocity from the gas suction opening 13 to 1.8 or more times the jet velocity from the air jet ports 12.

In this embodiment also, the gas suction opening 13 has an aperture 25 times the aperture of the air jet ports 14. In FIG. 12, a dotted line represents a relationship between suction efficiency and suction volume/jet volume. The suction volume is a product of the suction velocity and the aperture of the gas suction opening 13. The jet volume is a product of the jet velocity and the aperture of the air jet ports 12. Suction efficiency is set to 1 when the ratio between suction velocity and jet velocity is in the 1:1 ratio, i.e. the ratio between suction volume and jet volume is 25:1. As shown in FIG. 12, suction efficiency doubles when the suction volume from the gas suction opening 13 is 45 times the jet volume from the air jet ports 12. It will be seen that suction efficiency tends to increase when the suction volume is 45 or more times the jet volume. Thus, the gas/air may be sucked efficiently by setting the suction volume from the gas suction opening 13 to 45 or more times the jet volume from the air jet ports 12.

As seen from FIG. 12, the upward tendency of suction efficiency will fall off when the suction velocity/jet velocity ratio is about 3.5 or when the suction volume/jet volume ratio exceeds about 87. Assuming that the jet velocity and jet volume are fixed, it is necessary to increase the suction velocity or suction volume by the blower 54 in order to enlarge the suction velocity/jet velocity ratio or the suction volume/jet volume ratio. For this, the output of the blower 54 has to be increased. A prior knowledge of a limit where the upward tendency of suction efficiency falls off will be convenient since it is unnecessary to increase the output of the blower unduly. Similar results are obtained when the drum rotating speed is in a range of 10 to 12 m/sec.

Thus, when the drum rotating speed is set to 10 to 12 m/sec, it is preferred that the suction velocity/jet velocity ratio is set to 3.5 or less, or the suction volume/jet volume ratio is set to 87 or less.

Figure 13:
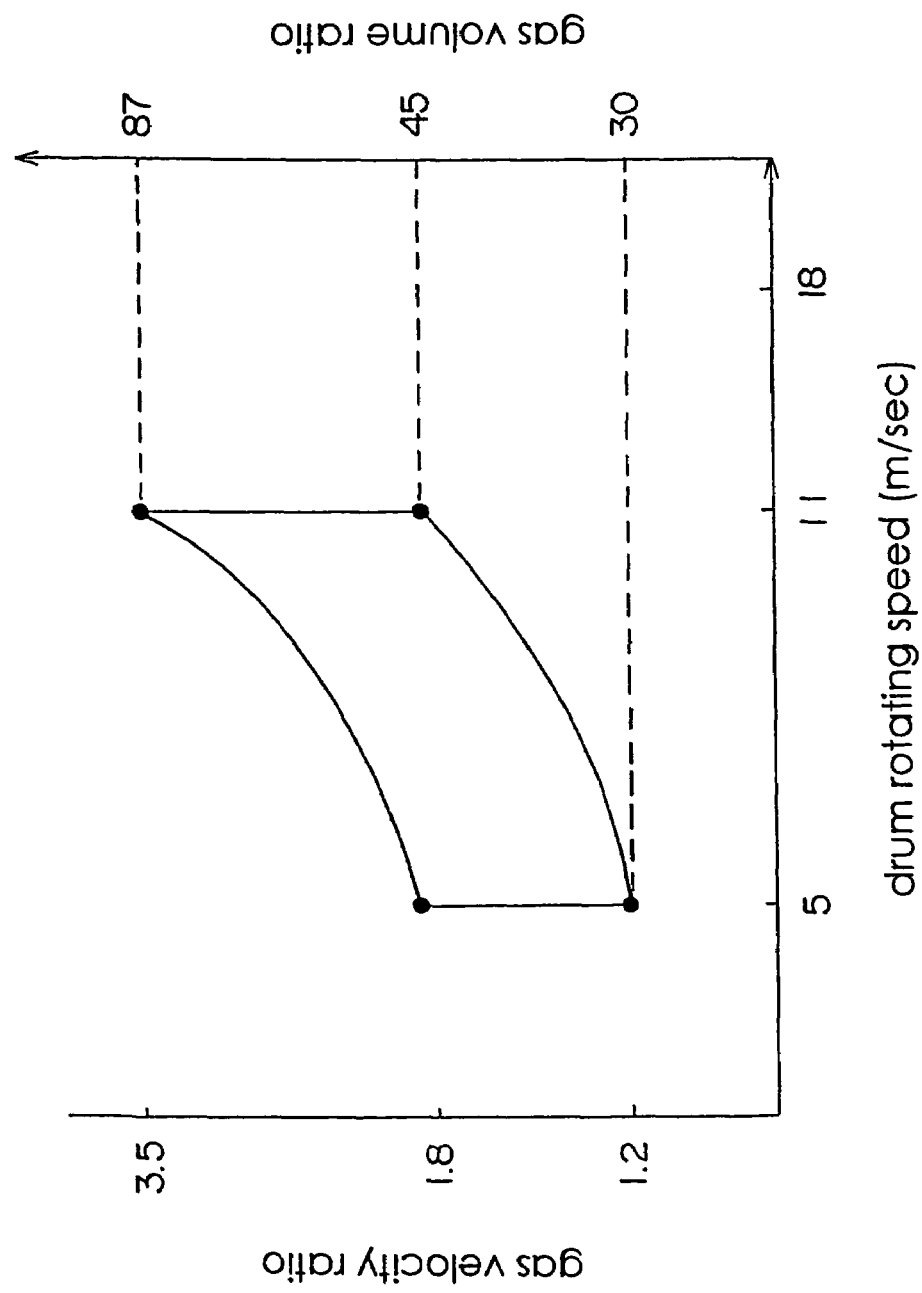
FIG. 13 is a graph showing ranges of velocity ratios and volume ratios for facilitating improvement in the suction efficiency of the gas diffusing suction unit in time of the rotating speed of the recording drum set in a range of 5 to 11 m/sec.

FIG. 13 is a graph showing ranges of gas velocity ratios and gas volume ratios for facilitating improvement in suction efficiency in time of the drum rotating speed set in a range of 5 to 11 m/sec. The distance W is fixed to 14 mm.

As seen from FIG. 13, when the drum rotating speed is set in the range of 5 to 11 m/sec, suction efficiency may easily be improved by setting at least the gas velocity ratio to 1.2 or gas volume ratio to 30 or more. That is, suction efficiency may be greatly improved only by slightly increasing the suction velocity or suction volume.

It will also be seen from FIG. 13 that, when the drum rotating speed is set in the range of 5 to 11 m/sec, there is no need to increase the gas velocity ratio to 3.5 or the gas volume ratio to 87 or more. This is because, when the gas velocity ratio or gas volume ratio is at the above value or higher, improvement in suction efficiency is slight for the increase in the suction velocity or suction volume.

Figure 10:
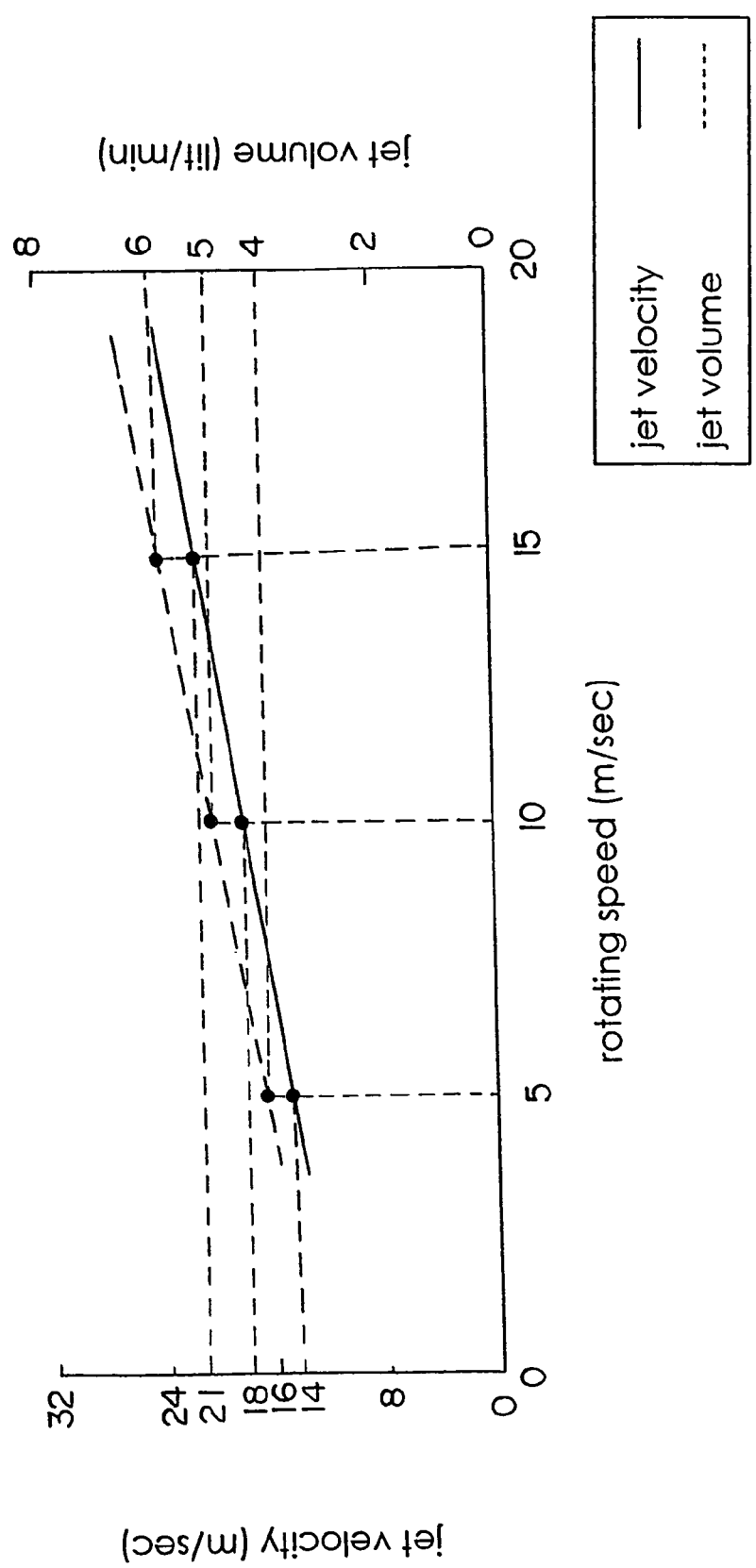
FIG. 10 is a graph illustrating results of a simulation for determining a required jet velocity and jet volume for each rotating speed of a recording drum in the image recording apparatus in the first embodiment of the invention.

FIG. 10 is a graph illustrating results of a simulation conducted for determining a required jet velocity and jet volume for each rotating speed of the recording drum 1 in the image recording apparatus in the first embodiment of the invention. It is actually necessary to determine a jet velocity and jet volume required to absorb the gas generated from the printing plate 40 for each rotating speed of the recording drum 1. However, it is difficult to estimate and quantify the gas generated from the printing plate 40. Thus, a fixed quantity of toner is sprinkled over the recording drum 1, and the recording drum 1 is rotated in this state to scatter the toner artificially. The recording drum 1 is rotated at varied speeds while appropriately varying the jet velocity and jet volume, to check whether the toner can be separated from the surface of the recording drum 1 at a rate exceeding a predetermined value. FIG. 10 is a graph reflecting results of the above test and showing a relationship between the rotating speed of the recording drum 1 and the jet velocity and jet volume from the air jet ports 12. The distance W between the installation plane of the air jet ports 12 in the gas diffusing suction unit 11 and the surface of the printing plate 40 is fixed to 14 mm.

In FIG. 10, a solid line shows the relationship between the rotating speed of the recording drum 1 and jet velocity, while a dotted line shows the relationship between the rotating speed of the recording drum 1 and jet volume. An increase in the rotating speed of the recording drum 1 generates viscous flows over the peripheral surface of the recording drum 1, which hamper separation of the toner (in practice, gas). In order to separate a predetermined quantity of toner (in practice, gas), as shown in FIG. 10, it is necessary to increase the jet velocity and jet volume with the increase in the rotating speed of the recording drum 1. As is clear from the graph of FIG. 10, the toner (in practice, gas) may be separated fully from the surface of the printing plate when the distance W between the installation plane of the air jet ports 12 in the gas diffusing suction unit 11 and the surface of the printing plate 40 is 14 mm, the recording drum 1 is rotated at 5 m/sec, the jet velocity is 14 m/sec, and the jet volume is 4.0 lit./min. Thus, when recording images with the above conditions, it is sufficient to set the jet velocity to about 14 m/sec and the jet volume to about 4.0 lit./min. In principle, there is no need to set the jet velocity and jet volume above these values.

It will be seen that, when the distance W is 14 mm and the recording drum 1 is rotated at 10 m/sec, the toner (in practice, gas) may be separated fully from the surface of the printing plate by setting the jet velocity to 18 m/sec and the jet volume to 5.0 lit./min. Thus, when recording images with these conditions, it is sufficient to set the jet velocity to about 18 m/sec and the jet volume to about 5.0 lit./min. In principle, there is no need to set the jet velocity and jet volume above these values.

Further, when the distance W is 14 mm and the recording drum 1 is rotated at 15 m/sec, the toner (in practice, gas) may be separated fully from the surface of the printing plate by setting the jet velocity to 21 m/sec and the jet volume to 6.0 lit./min.

Thus, when recording images with the above conditions, it is sufficient to set the jet velocity to about 21 m/sec and the jet volume to about 6.0 lit./min. In principle, there is no need to set the jet velocity and jet volume above these values.

Figure 11:
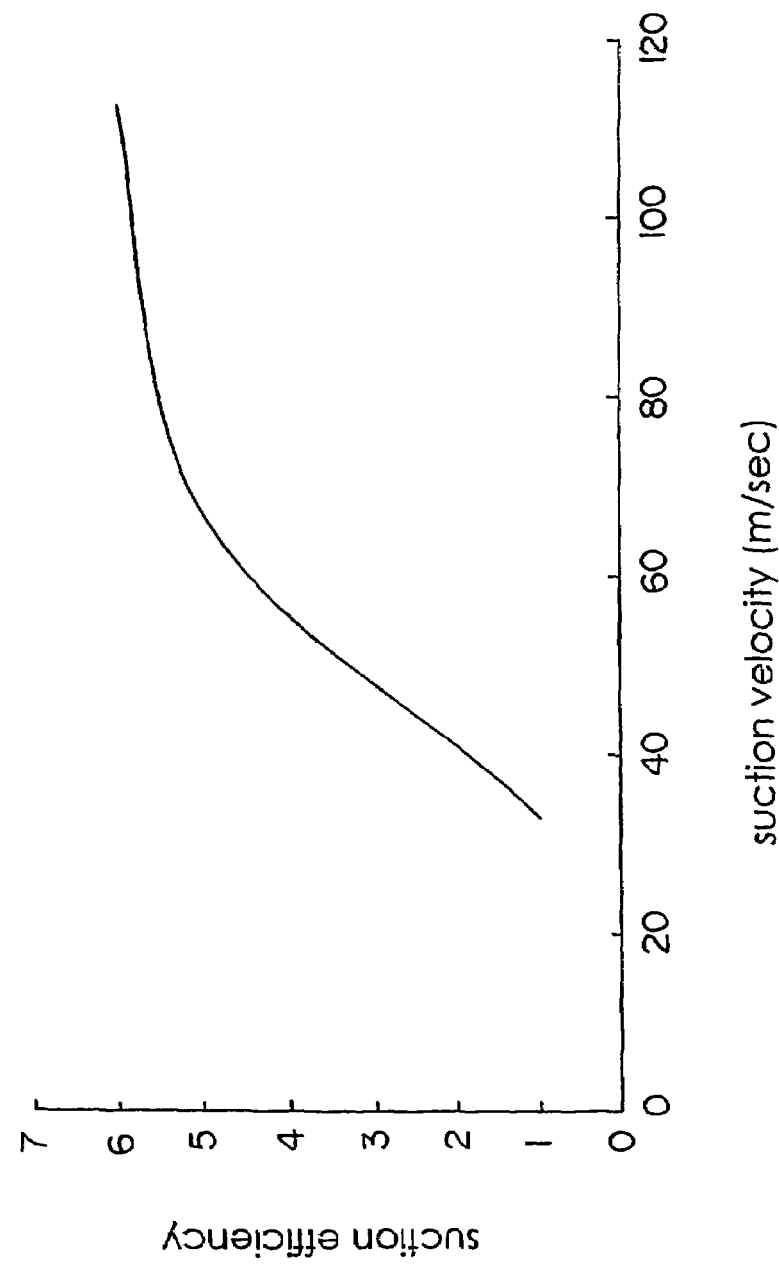
FIG. 11 is a graph showing a relationship between suction velocity and suction efficiency of the gas diffusing suction unit in time of the rotating speed of the recording drum set to 11.3 m/sec.

FIG. 11 is a graph showing a relationship between suction efficiency and suction velocity of the gas diffusing suction unit 11 in the image recording apparatus in the first embodiment of the invention.

FIG. 11 shows actual measurements of suction efficiency taken every 5 m/sec rise in the suction velocity when the distance W between the installation plane of the air jet ports 12 in the gas diffusing suction unit 11 and the surface of the printing plate 40 was fixed to 14 mm, the recording drum 1 rotated at 11.3 m/sec, and the suction velocity in a range of 33 to 113 m/sec. The jet velocity and jet volume were set to values obtained by applying the rotating speed 11.3 m/sec of the recording drum 1 to the graph of FIG. 10. That is, the jet velocity and jet volume were about 19 m/sec and about 5.5 lit./min, respectively. As shown in FIG. 11, when the suction velocity is about 70 m/sec or higher, only a minor increase occurs with the suction efficiency. The suction efficiency herein is determined by the quantity of the toner adhering to a filter disposed adjacent the gas exhaust port 15. In FIG. 11, when the rotating speed of the recording drum 1 is set to 11.3 m/sec and the suction velocity to 33 m/sec, the suction efficiency is set to 1.

As is clear from the foregoing description, when the suction velocity ratio is 70 m/sec or higher, improvement in suction efficiency is slack for the increase in the suction velocity. Thus, it will be seen that there is little need for setting the suction velocity to 70 m/sec or higher when making improvement at least over the image recording conditions (distance W, rotating speed of the recording drum 1, jet velocity and jet volume) illustrated in FIG. 11, that is when setting the distance W to 14 mm or less, the rotating speed of the recording drum 1 to 11.3 m/sec or less, the jet velocity to 19 m/sec or higher, and the jet volume to 5.5 lit/min or more. This information may be used to advantage for suitably determining performance of the blower 54.

By using the actual measurement results shown in FIGS. 9 through 11, the controller 56 can adjust the jet velocity and volume from the air jet ports 12 of the gas diffusing suction unit 11 and the suction velocity and volume from the gas suction opening 13 to optimal values according to the rotating speed of the recording drum 1 and the type of printing plate 40.

In order to improve image recording efficiency, the quantity of light of each laser diode included in the laser diode array 22 may be varied, or the number of laser diodes driven may be adjusted. In such a case also, the quantity of gas generated from the printing plate 40 varies. The controller 56 may adjust the jet velocity and volume and the suction velocity and volume accordingly.

The jet velocity and volume and the suction velocity and volume may be adjusted also according to images to be recorded on the printing plate 40. This is because the quantity of gas generation is considered variable with the type of images formed on the printing plate 40 (whether or not the image requires large quantities of light per unit time from the laser diodes).

In the image recording apparatus in the first embodiment of this invention, as described above, the gas generated in time of exposure of the printing plate 40 is diffused by the air blown from the air jet ports 12 of the gas diffusing suction unit 11, and the diffused gas is efficiently sucked into the gas suction opening 13 of the gas diffusing suction unit 11. This effectively prevents the gas from entering the exposure head 8 to contaminate the interior of the exposure head 8, and from adhering to the objective lens 16 to fog the objective lens 16. Thus, deterioration in image quality due to contamination of the exposure optical system by the gas may be prevented effectively.

A second embodiment of this invention will be described next with reference to the image recordings.

Figure 14:
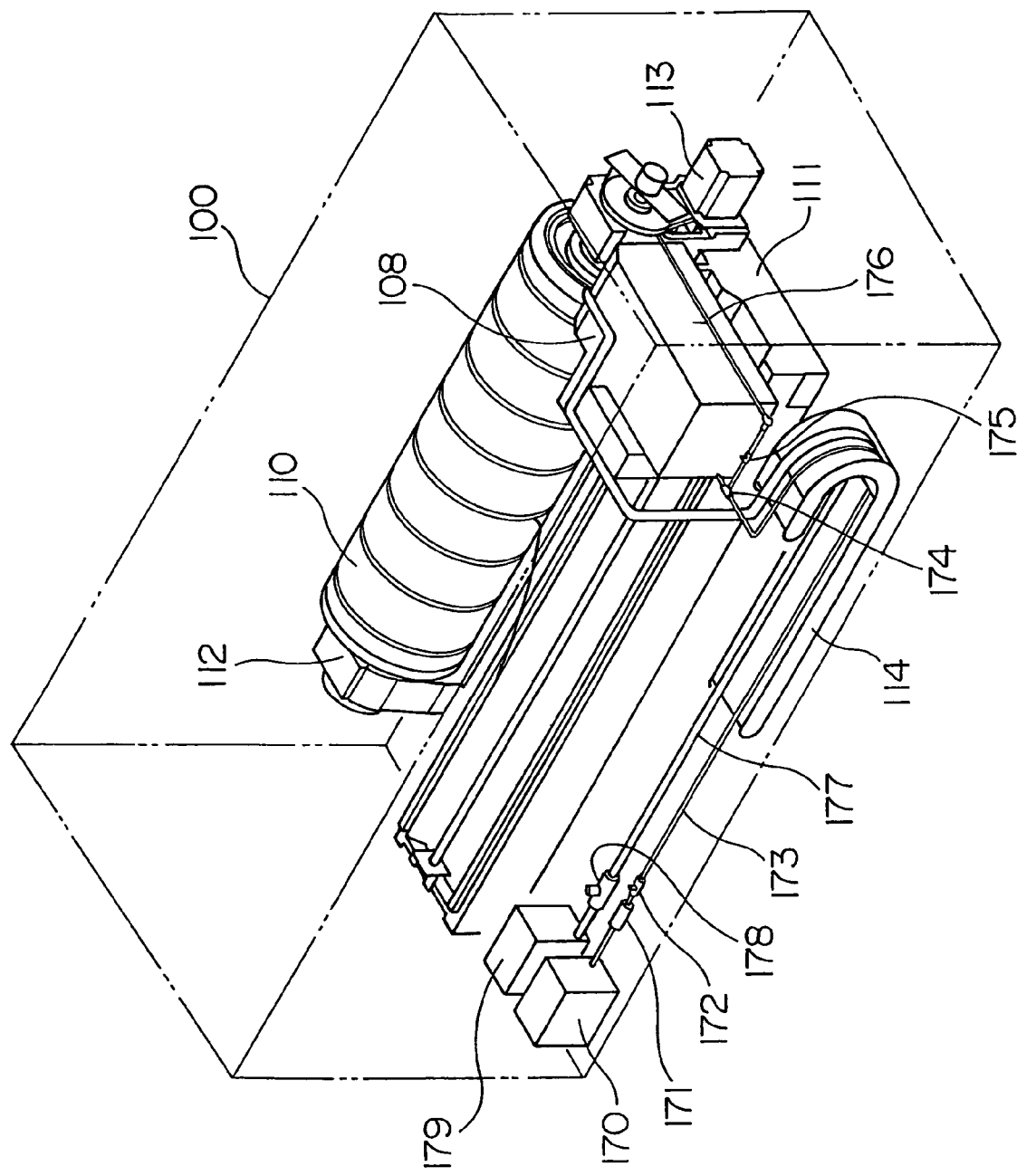
FIG. 14 is a perspective view of an image recording apparatus in a second embodiment of the invention.

FIG. 14 is a perspective view of an image recording apparatus in the second embodiment of the invention. The image recording apparatus in the second embodiment has a housing 100. The apparatus includes, arranged inside the housing 100, a base 111, a recording drum 110 rotatably supported by a pair of bearings 112 formed on the base 111, a motor 113 for rotating the recording drum 110, an exposure head 108 mounted on the base 111 to be movable along an axis of rotation of the recording drum 110, a signal cable (not shown) for supplying image signals to the exposure head 108, a power cable (not shown) for supplying power to the exposure head 108, a jet pipe 173 to be described in detail hereinafter, an exhaust pipe 177 described in detail hereinafter, a cable bearer 114 for guiding the jet pipe 173 and exhaust pipe 177, a jet pump 170, and an exhaust pump 179.

The recording drum 110 of the image recording apparatus in the second embodiment of the invention, as in the first embodiment, has forward end clamps 102 (FIG. 16) and rear end clamps 103 (FIG. 16) arranged peripherally thereof. An aluminum printing plate 101 (FIG. 16) acting as a photosensitive material is mounted peripherally of the recording drum 110 and fixed thereto by the forward end clamps 102 and rear end clamps 103.

Figure 15:
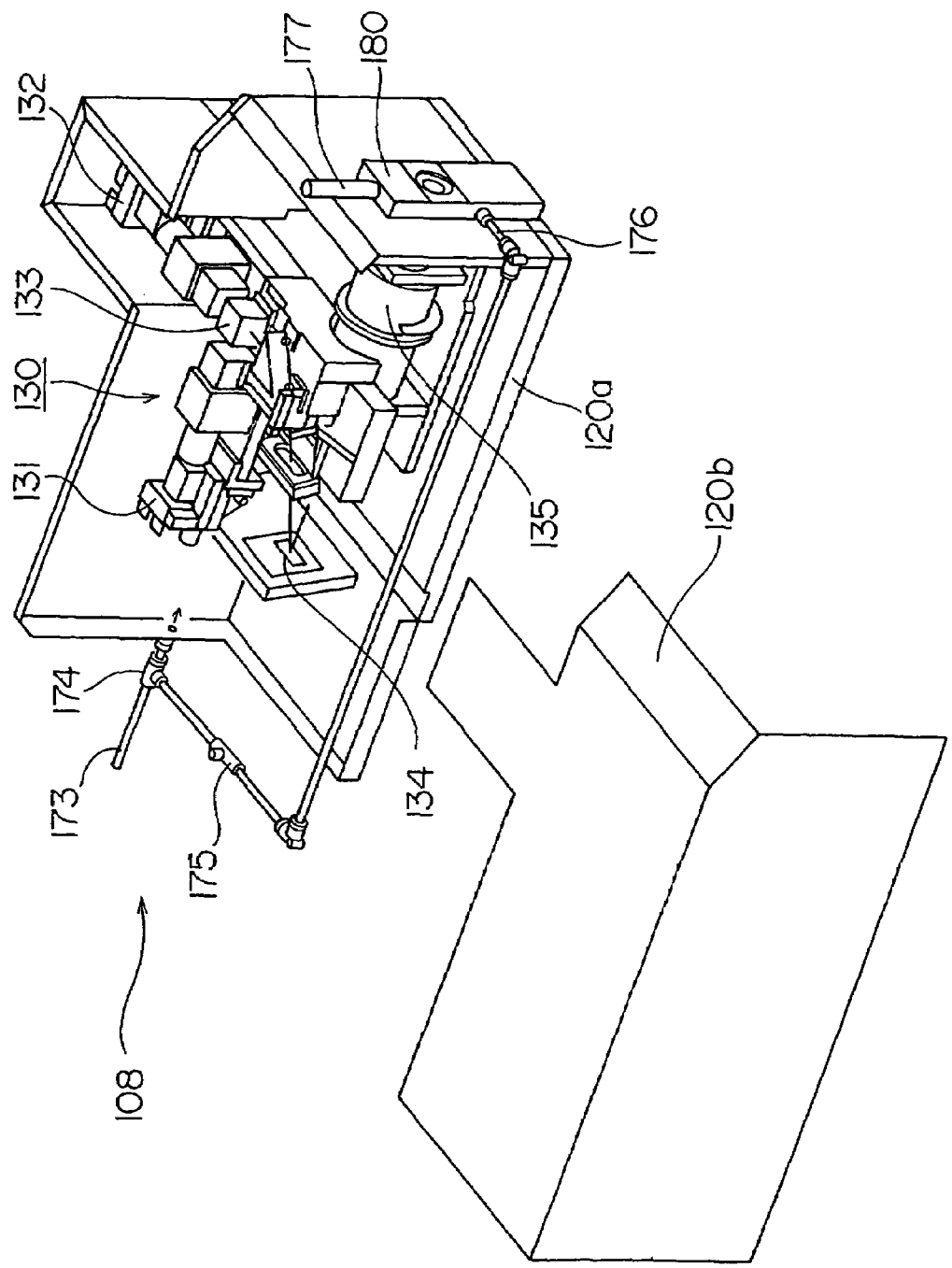
FIG. 15 is a perspective view showing a detailed construction inside an exposure head in the image recording apparatus in the second embodiment of the invention.

The exposure head 108 includes a laser light source 130 mounted therein (FIG. 15). The laser light source 130 is controlled according to the image signals. The laser light source 130 emits laser light toward the printing plate 101 fixed to the peripheral surface of the recording drum 110.

Synchronously with rotation of the recording drum 110, the exposure head 108 is moved in an auxiliary scanning direction (parallel to the axis of rotation of the recording drum 110) to form a desired two-dimensional image on the printing plate 101 fixed to the recording drum 110.

The jet pump 170 is in the form of a compressor or blower having a function to take in ambient air from outside the housing 100 and feed the air under pressure into the jet pipe 173. A filter 171 is mounted between the jet pump 170 and the jet pipe 173. Consequently, clean air stripped of impurities is fed into the jet pipe 173. The jet pipe 173 has a first flow regulating valve 172 disposed in an intermediate position thereof. Thus, the flow rate of the air supplied from the jet pump 170 may be adjusted.

The jet pipe 173 is connected to a back surface of the exposure head 108 (the surface of the exposure head 108 facing away from the peripheral surface of the recording drum 110). The jet pipe 173 is connected in an intermediate position thereof to a second jet pipe 176 by a branch pipe 174. The second jet pipe 176 is a pipe for supplying air to a gas diffusing suction unit 180 shown in FIG. 15. A second flow control valve 175 disposed in an intermediate position of the second jet pipe 176 adjusts the quantity of air fed into the exposure head 108 and the quantity of air fed to the gas diffusing suction unit 180.

A gas mixture of air and the gas generated from the printing plate 101 in time of exposure is collected by the gas diffusing suction unit 180 described in detail hereinafter. The gas mixture collected is transmitted to the exhaust pump 179 through the exhaust pipe 177. The flow rate of the gas mixture exhausted is adjusted by a third flow control valve 178 mounted in an intermediate position of the exhaust pipe 177.

FIG. 15 is a perspective view showing a detailed construction inside the exposure head 108.

The exposure head 108 includes a case 120, the laser light source 130 mounted inside the case 120, and the gas diffusing suction unit 180 attached to a front surface of the case 120.

The case 120 is a highly gastight container. This case 120 consists of a lower case 120a and an upper case 120b. The lower case 120a and upper case 120b are combined so that the laser light source 130 is shielded gastight against the atmosphere inside the housing 100. A laser emitting bore 187 (FIG. 16) is formed in a surface of lower case 120a opposed to the recording drum 110.

The laser light source 130 is disposed on a bottom surface in the lower case 120a. The laser light source 130 includes two laser units 131 and 132, a synthesizer 133 for synthesizing two laser beams emitted from the laser units 131 and 132, a modulator 134 for selectively reflecting the synthesized laser light in response to image signals, and an imaging optical system 135 for focusing the laser light reflected from the modulator 134 on the printing plate 101 through the laser emitting bore 187 and an objective lens 186.

Figure 16:
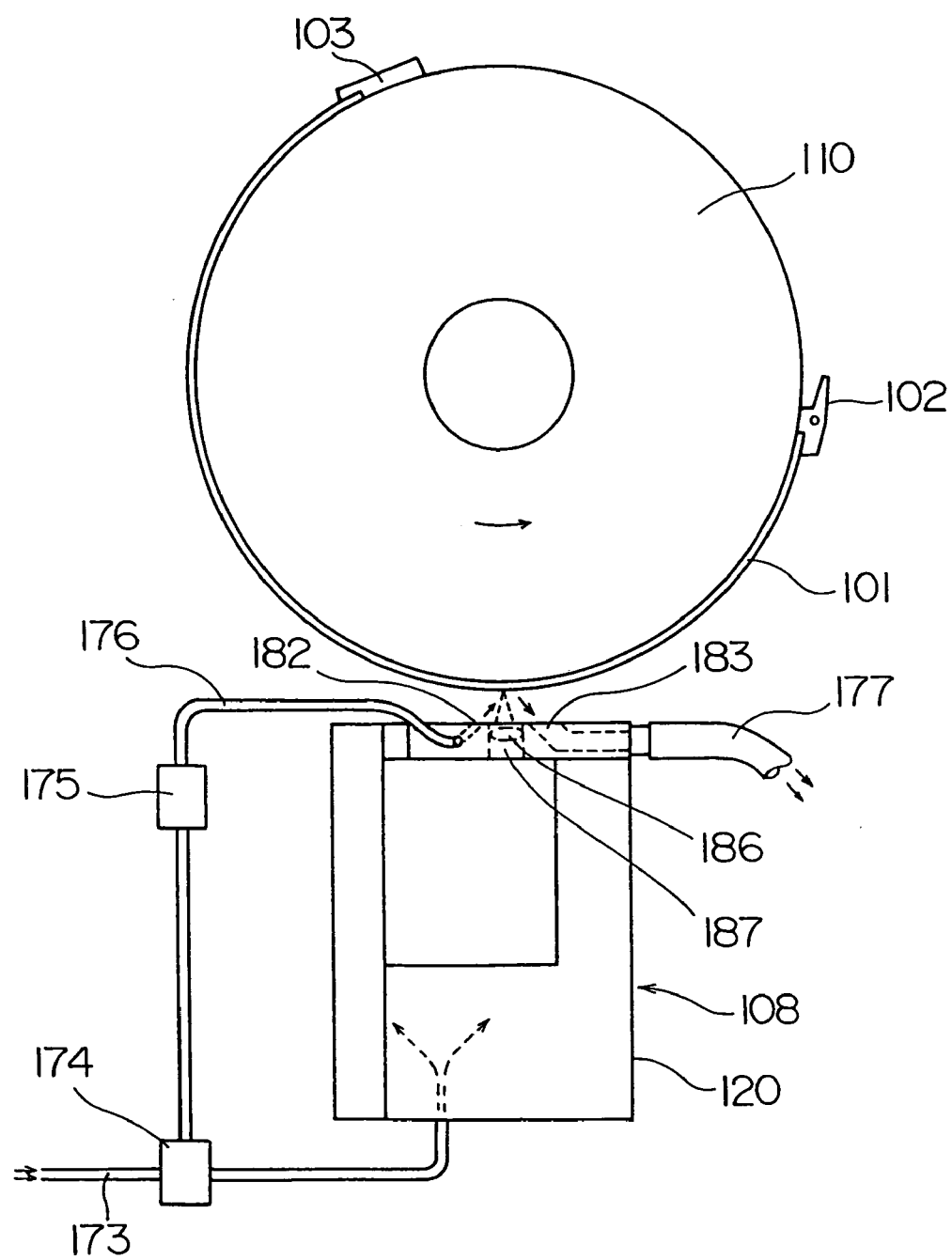
FIG. 16 is a schematic view showing the interior of the exposure head and adjacent components in the image recording apparatus in the second embodiment of the invention.

FIG. 16 is a schematic view showing the interior of the exposure head 108 and adjacent components in the image recording apparatus in the second embodiment of the invention.

As shown in FIG. 16, the printing plate 101 is fixed to the peripheral surface of the recording drum 110 by the forward end clamps 102 and the rear end clamps 103. The gas diffusing suction unit 180 is attached to the front surface of the exposure head 108.

The gas diffusing suction unit 180 includes an air jet port 182 for jetting the air supplied from the second jet pipe 176 toward a position on the printing plate 101 not irradiated by the laser light, the objective lens 186 disposed in a position corresponding to the laser emitting bore 187, a gas suction opening 183 located downstream of the air jet port 182 with respect to an air jetting direction from the air jet port 182, and the exhaust pipe 177 in communication with the gas suction opening 183 for transmitting the sucked and collected gas to the exhaust pump 179. The air jetting from the air jet port 182 serves to diffuse the gas generating from the printing plate 101. The diffused gas and the air jetting from the air jet port 182 are sucked into the gas suction opening 183. In order to realize an increased efficiency of collecting the gas diffused by the air jet ports 182, the gas suction opening 183, preferably, has a larger area than the air jet port 182.

The gas generated from the printing plate 101 by irradiation of the laser light is diffused by rotation in the direction of arrow A of the recording drum 110. The gas entering the housing 100 to contaminate the objective lens 186 in the exposure head 10 and other components in the housing 100 would lower light efficiency and adversely influence the image recording performance of the exposure head 108. This is conspicuous when the objective lens 108 is contaminated and fogged. This is true also when the gas enters the exposure head 108 and contaminates lenses forming parts of the laser light source 130.

In order to prevent such contamination, the image recording apparatus in the second embodiment of the invention provides the gas diffusing suction unit 180 on the front surface (opposed to the recording drum 110) of the exposure head 108, and sets a higher pressure inside the exposure head 108 than inside the housing 100. In this way, the apparatus is constructed for preventing the gas from entering the exposure head 108.

As shown in FIG. 16, clean air is fed under pressure through the jet pipe 173 into the case 120 of the exposure head 108. The clean air from the jet pump 170 is filled into the exposure head 108. As a result, the interior of the exposure head 108 is at a higher pressure than its exterior, and the air blows out of the exposure head 108 through openings such as clearances. It is therefore possible to prevent entry of dust from outside the exposure head 108 and the gas generated by heat reaction of the printing plate 101. Consequently, the lenses inside the exposure head 108 are free from contamination to maintain an excellent image recording performance.

With the image recording apparatus in the second embodiment of the invention, the gas diffusing suction unit 180 produces air currents in a space in front of the objective lens 186. That is, by feeding air from the second jet pipe 176, the air is jetted from the air jet port 182, and the gas generated from the printing plate 101 is sucked into the gas suction opening 183. Air currents are thereby formed in the space in front of the objective lens 186. Thus, the gas has little chance of adhering to the objective lens 186, and a secondary phenomenon takes place in which atmospheric pressure in front of the objective lens 186 becomes lower than in front spaces of other parts of the exposure head 108. As a result, even if clearances exist in the mounting position of the objective lens 186 and in the laser emitting bore 187, the gas will never enter the exposure head 108 through such clearances.

This is because the atmospheric pressure in front of the objective lens 186 is lower than the atmospheric pressure in front of other parts of the exposure head 108, and the air under pressure inside the exposure head 108 has a strong tendency to blow out through any clearances in the mounting position of the objective lens 186 and in the laser emitting bore 187. Thus, the gas can hardly enter the exposure head 108 from the space in front of the objective lens 186 (the space opposed to the objective lens 186) having the highest concentration of the gas.

Further, as schematically shown in FIG. 16, air currents are formed inside the exposure head 108 to flow from the back surface of the exposure head 108 (the surface facing away from the recording drum 110) toward the front face of the exposure head 108 (the surface opposed to the recording drum 110). As shown in FIG. 14, these air currents are derived from air taken from a position remote from the recording drum 110, and are not heated by image recording action of the exposure head 108. Thus, these air currents can cool the various components (i.e. the laser units 131 and 132, synthesizer 133, modulator 134 and imaging optical system 135) of the laser light source 130.

This invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2003-062673 filed in the Japanese Patent Office on Mar. 10, 2003, Japanese Patent Application No. 2003-086661 filed in the Japanese Patent Office on Mar. 27, 2003, and Japanese Patent Application No. 2004-015164 filed in the Japanese Patent Office on Jan. 23, 2004, the entire disclosure of which is incorporated herein by reference.

What is claimed is:

1. An image recording apparatus having a drum for supporting a photosensitive material mounted on a peripheral surface thereof, a drive device for rotating the drum about an axis thereof, and a recording device for recording an image on the photosensitive material mounted on the peripheral surface of the drum, said recording device comprising:
a light emitting device for emitting a light beam to said photosensitive material on said drum;
a jetting device including a jet port disposed upstream of said light emitting device with respect to a direction of rotation of said drum for jetting a first gas for diffusing a second gas generated by irradiation of the light from said light emitting device; and
a suction device including a suction opening disposed downstream of said light emitting device with respect to the direction of rotation of said drum and having a larger diameter than said jet port for sucking the second gas diffused by said jetting device, the gases being sucked at a velocity higher than a velocity of the first gas jetted from said jetting device and in a larger volume per unit time than a volume per unit time of the first gas jetted from said jetting device;
wherein the ratio of the velocity of the gases sucked by said suction device to the velocity of the first gas jetted from said jetting device, or the ratio of the volume per unit time of the gases sucked by said suction device to the volume per unit time of the first gas jetted from said jetting device, is increased in relation to increased drum rotating speed.

2. An image recording apparatus as defined in claim 1, wherein the velocity of the gases sucked by said suction device is at least 1.2 times the velocity of the first gas jetted from said jetting device.

3. An image recording apparatus as defined in claim 2, wherein the volume per unit time of the gases sucked by said suction device is at least 30 times the volume per unit time of the first gas jetted from said jetting device.

4. An image recording apparatus as defined in claim 3, wherein a direction for jetting the first gas from said jet port and a normal to the peripheral surface of said drum intersect each other at an angle of 40 to 50 degrees.

5. An image recording apparatus as defined in claim 4, wherein said photosensitive material is attached to the peripheral surface of said drum by a clamp mechanism arranged on the peripheral surface of said drum.

6. An image recording apparatus as defined in claim 3, wherein said drive device is arranged to rotate said drum at 4.5 to 6 m/sec.

7. An image recording apparatus as defined in claim 6, wherein the velocity of the gases sucked by said suction device is at most 1.8 times the velocity of the first gas jetted from said jetting device.

8. An image recording apparatus as defined in claim 6, wherein the volume per unit time of the gases sucked by said suction device is at most 45 times the volume per unit time of the first gas jetted from said jetting device.

9. An image recording apparatus as defined in claim 3, wherein said drive device is arranged to rotate said drum at 10 to 12 m/sec.

10. An image recording apparatus as defined in claim 9, wherein the velocity of the gases sucked by said suction device is at most 3.5 times the velocity of the first gas jetted from said jetting device.

11. An image recording apparatus as defined in claim 9, wherein the volume per unit time of the gases sucked by said suction device is at most 87 times the volume per unit time of the first gas jetted from said jetting device.

12. An image recording apparatus as defined in claim 1, wherein the velocity of the gases sucked by said suction device is at most 70 m/sec.

13. An image recording apparatus as defined in claim 12, wherein said drive device is arranged to rotate said drum at 10 to 12 m/sec.

14. An image recording apparatus as defined in claim 13, wherein said jet port or said suction opening is spaced from said photosensitive material mounted on said drum by a distance of 10 to 20 mm.

15. An image recording apparatus as defined in claim 14, wherein the velocity of the first gas jetted from said jetting device is at most 19 m/sec.

16. An image recording apparatus as defined in claim 14, wherein the volume of the first gas jetted from said jetting device is at most 5.5 lit/min.

17. An image recording apparatus as defined in claim 1, wherein said drive device is arranged to rotate said drum at 5 to 15 m/sec, and the velocity of the first gas jetted from said jetting device is at most 21 m/sec.

18. An image recording apparatus as defined in claim 17, wherein said drive device is arranged to rotate said drum at 5 to 10 m/sec, and the velocity of the first gas jetted from said jetting device is at most 18 in/sec.

19. An image recording apparatus as defined in claim 17, wherein said jet port or said suction opening is spaced from said photosensitive material mounted on said drum by a distance of at most 14 mm.

20. An image recording apparatus as defined in claim 1, wherein said drive device is arranged to rotate said drum at 5 to 15 m/sec, and the volume of the first gas jetted from said jetting means is at most 6 lit/min.

21. An image recording apparatus as defined in claim 20, wherein said drive device is arranged to rotate said drum at 5 to 10 m/sec, and the volume of the first gas jetted from said jetting device is at most 5 lit/min.

22. An image recording apparatus having a drum for supporting a photosensitive material mounted on a peripheral surface thereof, and a drive device for rotating the drum about an axis thereof at a rotating speed which can be varied, and a recording device for recording an image on the photosensitive material mounted on the peripheral surface of the drum, said recording device comprising:

a jetting device including a jet port disposed upstream of said light emitting device with respect to a direction of rotation of said drum for jetting a first gas for diffusing a second gas generated by irradiation of the light from said light emitting device wherein a direction for jetting the first gas from said jet port and a normal to the peripheral surface of said drum intersect each other at an angle of 40 to 50 degrees;

a suction device including a suction opening disposed downstream of said light emitting device with respect to the direction of rotation of said drum and having a larger diameter than said jet port for sucking the second gas diffused by said jetting device, the gases being sucked at a velocity higher than a velocity of the first gas jetted from said jetting device and in a larger volume per unit time than a volume per unit time of the first gas jetted from said jetting device;

wherein said jet port or said suction opening is spaced from said photosensitive material mounted on said drum by a distance of 10 to 20 mm;

wherein when said drive device is arranged to rotate said drum at 4.5 to 6 m/sec,
   the velocity of the gases sucked by said suction device is at least 1.2 to 1.8 times the velocity of the first gas jetted from said jetting device, or
   the volume per unit time of the gases sucked by said suction device is at least 30 to 45 times the volume per unit time of the first gas jetted from said jetting device; and wherein when said drive device is arranged to rotate said drum at 10 to 12 m/sec,
   the velocity of the gases sucked by said suction device is at least 1.8 to 3.5 times the velocity of the first gas jetted from said jetting device, or
   the volume per unit time of the gases sucked by said suction device is at least 45 to 87 times the volume per unit time of the first gas jetted from said jetting device.

23. An image recording apparatus as defined in claim 22, wherein said photosensitive material is attached to the peripheral surface of said drum by a clamp mechanism arranged on the peripheral surface of said drum.

24. An image recording apparatus as defined in claim 23, wherein the velocity of the gases sucked by said suction device is at most 70 m/sec.

25. An image recording apparatus as defined in claim 22, wherein said jet port or said suction opening is spaced from said photosensitive material mounted on said drum by a distance of at most 14 mm.

* * * * *